United States Patent
Korenaga

(10) Patent No.: US 6,873,404 B2
(45) Date of Patent: Mar. 29, 2005

(54) STAGE APPARATUS AND METHOD OF DRIVING THE SAME

(75) Inventor: Nobushige Korenaga, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/187,854

(22) Filed: Jul. 3, 2002

(65) Prior Publication Data

US 2003/0007140 A1 Jan. 9, 2003

(30) Foreign Application Priority Data

Jul. 9, 2001 (JP) ........................................ 2001-208550

(51) Int. Cl.$^7$ ........................ G03B 27/58; G03B 27/42; G03B 27/62; H02K 41/00
(52) U.S. Cl. ............................ 355/72; 355/53; 355/75; 310/12
(58) Field of Search .............................. 355/72, 53, 75; 310/12; 378/210, 34; 318/649; 267/136

(56) References Cited

U.S. PATENT DOCUMENTS

| | | | |
|---|---|---|---|
| 5,467,720 A | 11/1995 | Korenaga et al. | 108/20 |
| 5,684,856 A | 11/1997 | Itoh et al. | 378/34 |
| 5,841,250 A | 11/1998 | Korenage et al. | 318/135 |
| 6,002,465 A | 12/1999 | Korenaga | 355/53 |
| 6,037,680 A | 3/2000 | Korenaga et al. | 310/12 |
| 6,107,703 A | 8/2000 | Korenaga | 310/12 |
| 6,128,069 A | 10/2000 | Korenaga | 355/53 |
| 6,144,719 A * | 11/2000 | Hasegawa et al. | 378/34 |
| 6,157,159 A | 12/2000 | Korenaga et al. | 318/649 |
| 6,172,738 B1 | 1/2001 | Korenaga et al. | 355/53 |
| 6,177,978 B1 | 1/2001 | Korenaga | 355/53 |
| 6,281,655 B1 * | 8/2001 | Poon et al. | 318/649 |
| 6,322,060 B1 * | 11/2001 | Mayama et al. | 267/136 |
| 6,359,677 B2 | 3/2002 | Itoh et al. | 355/53 |
| 6,414,742 B1 | 7/2002 | Korenaga et al. | 355/53 |
| 6,570,645 B2 | 5/2003 | Korenaga et al. | 355/75 |
| 2003/0034695 A1 * | 2/2003 | Binnard et al. | 310/12 |

FOREIGN PATENT DOCUMENTS

JP 2000-106344 4/2000

* cited by examiner

*Primary Examiner*—Peter B. Kim
(74) *Attorney, Agent, or Firm*—Fitzpatrick, Cella, Harper & Scinto

(57) ABSTRACT

A stage apparatus includes a first stage, having a first linear motor portion with an iron core, for moving a first table, to move the first table with respect to a base table by driving the first linear motor portion, a second stage having a second linear motor portion connected to the first table and a second table, to move the second table, and an electromagnetic coupling provided between the first and second tables to apply an accelerating force to the second table in accordance with acceleration or deceleration of the first linear motor.

14 Claims, 16 Drawing Sheets

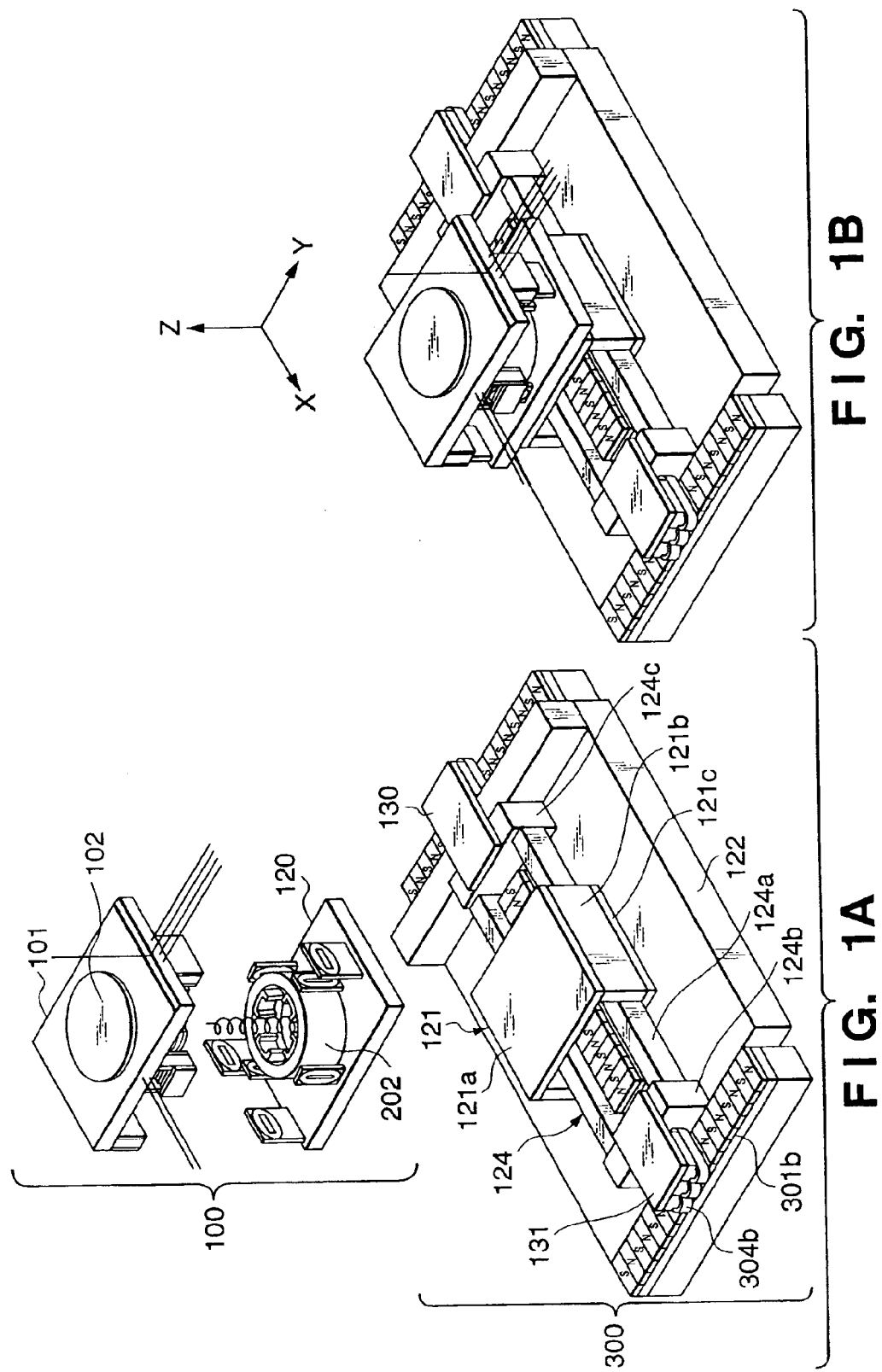

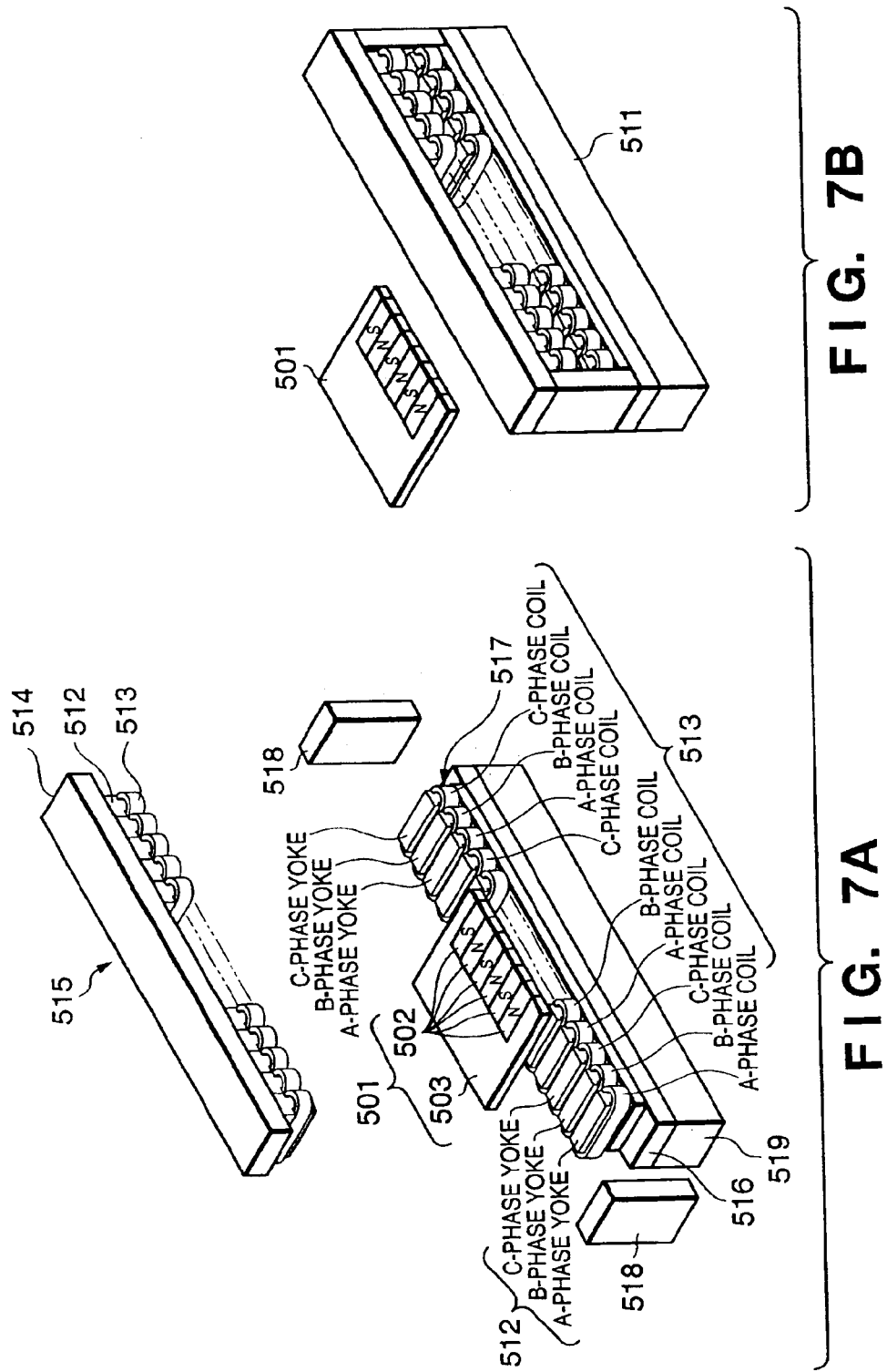

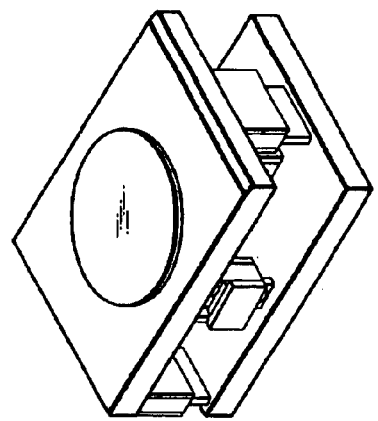
FIG. 12C *PRIOR ART*
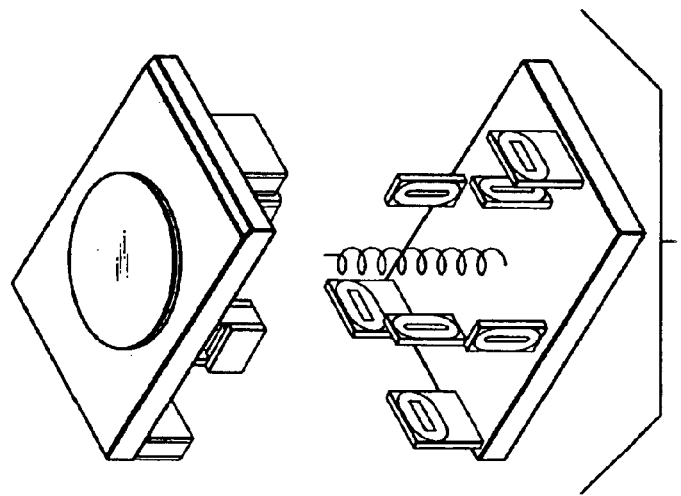
FIG. 12B *PRIOR ART*
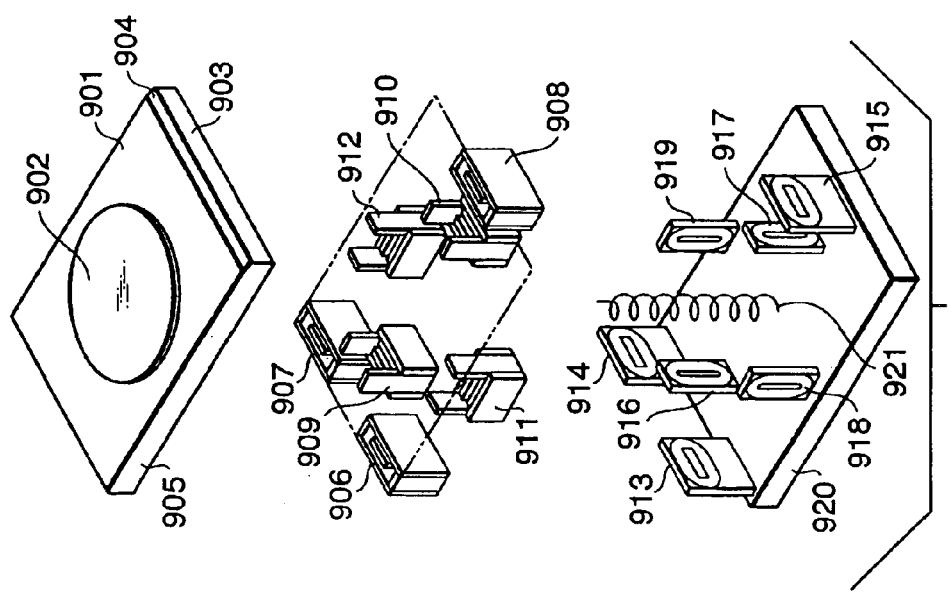
FIG. 12A *PRIOR ART*

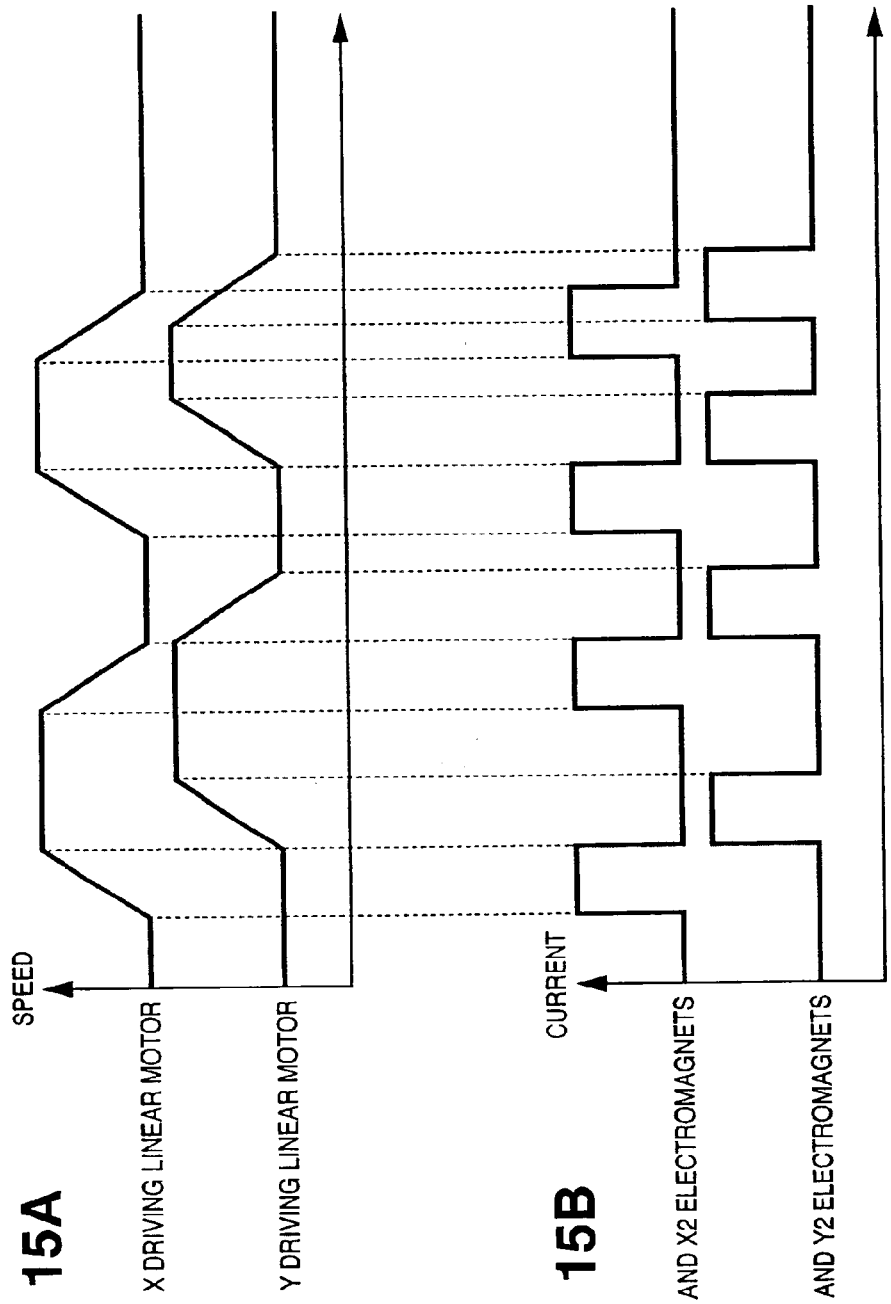

STAGE APPARATUS AND METHOD OF DRIVING THE SAME

FIELD OF THE INVENTION

The present invention relates to a stage apparatus which can be suitably used in a semiconductor manufacturing apparatus and the like, and a method of driving the same.

BACKGROUND OF THE INVENTION

FIG. 9 is a view showing the general arrangement of a wafer stage in an exposure apparatus. FIG. 10 is an exploded view showing the structure of the wafer stage shown in FIG. 9. FIGS. 11A and 11B are views showing the arrangement of a coarse movement stage portion in the wafer stage shown in FIG. 9. FIGS. 12A, 12B, and 12C are views showing the arrangement of a fine movement stage portion in the wafer stage shown in FIG. 9. FIGS. 13A, 13B, and 13C are views showing the arrangement of a fine movement stage linear motor used in the wafer stage shown in FIG. 9. FIG. 14 is a view showing the arrangement of a coarse movement stage linear motor for the wafer stage shown in FIG. 9.

The wafer stage is roughly comprised of a coarse movement stage for long stroke movement in the X-Y direction, and a fine movement stage for precise positioning. The top plate of the fine movement stage is characteristically controlled directly by a linear motor in six-axis directions.

The fine movement stage will be described first.

A wafer top plate 901 serves for placing a wafer as a work on it and positioning the wafer in six degree-of-freedom directions of X, Y, Z, ωx, ωy, and ωz. The wafer top plate 901 is a rectangular plate, and has the wafer chuck 902 at its center to place the wafer on it.

Mirrors 903, 904, and 905 for reflecting laser beams from interferometers are provided to the side surface of the wafer top plate 901, so the position of the wafer top plate 901 can be measured. More specifically, the wafer top plate 901 is irradiated with a total of six light beams, so its six degree-of-freedom positions are measured. With two interferometer beams parallel to the X-axis and having different Z positions, the position in the X direction and the amount of rotation in the ωy direction can be measured. With three interferometer beams parallel to the Y-axis and having different X and Z positions, the position in the Y direction and the amounts of rotation in the ωx and ωy directions can be measured. With a beam irradiated to a C-surface portion (904) of the mirror, the position in the Z direction can be measured. In fact, the measurement values obtained with these beams are not independent of each other but interfere with each other. X, Y, Z, ωx, ωy, and ωz of a typical position can be measured by coordinate transformation as a rigid body.

Seven linear motor movable elements (906 to 912) are attached to the lower surface of the wafer top plate 901. As shown in FIGS. 13A and 13B, each movable element has two sets of yokes (911a and 911d, 906a and 906d) and bipolar magnets (911b and 911c, 906b and 906c) magnetized in the direction of thickness. The two sets of magnets and yokes are connected to each other with side plates to form a box-like structure. The respective movable elements oppose each other to sandwich linear motor stators (918, 913) (to be described later) in a noncontact manner.

Of the seven movable elements, the three movable elements 906 to 908 arranged on the side ends of the rectangular top plate form Z movable elements. In the Z movable element, as shown in FIG. 13A, the bipolar magnets 906b and 906c are arrayed in the Z direction, and mutually act with a current flowing through a Z stator elliptic coil 913b (described later) with a straight portion perpendicular to the Z direction, thereby generating a thrust in the Z direction. These movable elements will be named Z1 to Z3 movable elements (906 to 908).

The four remaining movable elements 909 to 912 are arranged substantially at the center of the rectangular top plate. Of the four movable elements, two form X movable elements. In the X movable element, as shown in FIG. 13C, the bipolar magnets 909b are arrayed in the X direction, and mutually act with a current flowing through an X stator elliptic coil (described later) with a straight portion perpendicular to the X direction, thereby generating a thrust in the X direction. These movable elements will be named X1 and X2 movable elements (909, 910).

The two remaining movable elements form Y movable elements. In the Y movable element, as shown in FIG. 13B, the bipolar magnets 911b and 911c are arrayed in the Y direction, and mutually act with a current flowing through a Y stator elliptic coil (described later) 918b with a straight portion perpendicular to the Y direction, thereby generating a thrust in the Y direction. These movable elements will be named Y1 and Y2 movable elements (911, 912).

The seven linear motor stators 913 to 919 described above for controlling the position of the wafer top plate 901 in the six-axis directions, and one end of a self-weight support spring 921 for supporting the weight of the wafer top plate 901 are fixed to the upper portion of an intermediate plate 920. The stators 913 to 919 support the elliptic coils with peripheral frames, as shown in FIGS. 13A to 13C, and face the linear motor movable elements 906 to 912 (described above) fixed to the lower surface of the wafer top plate 901 in a noncontact manner.

Of the seven stators, the three ones arranged at almost the ends of the sides of the rectangular X stage upper plate form Z stators (913 to 915). In the Z stator, as shown in FIG. 13A, the elliptic coil 913b is arranged such that its straight portion is perpendicular to the Z direction. Thus, the elliptic coil 913b can exert a thrust in the Z direction on those bipolar magnets of the Z movable element (906, 907, or 908) which are arranged in the Z direction. These coils will be named Z1, Z2, and Z3 coils.

The four remaining stators are arranged at the center of the intermediate plate 920. Of the four remaining stators, two form X stators (916, 917). In the X stator, as shown in FIG. 13C, the two straight portions of an elliptic coil 916b are perpendicular to the X direction. The two straight portions are arranged along the X direction. Thus, the elliptic coil 916b can exert a thrust in the X direction on those bipolar magnets of the X movable element 909 or 910 which are arranged along the X direction. These coils will be named X1 and X2 coils.

The two remaining stators are also arranged at the center of the intermediate plate and form Y stators 918 and 919. In the Y stator, as shown in FIG. 13B, the two straight portions of the elliptic coil 918b are perpendicular to the Y direction. The two straight portions are arranged along the Y direction. Thus, the elliptic coil can exert a thrust in the Y direction on those bipolar magnets of the Y movable element which are arranged along the Y direction. These coils will be named Y1 and Y2 coils.

These seven linear motors generate a thrust in accordance with the so-called Lorentz force. In the following description, a linear motor formed of a Z stator and a Z movable element will be referred to as a Z fine movement linear motor, a linear motor formed of an X stator and an X movable element will be referred to as an X fine movement linear motor, and a linear motor formed of a Y stator and a Y movable element will be referred to as a Y fine movement linear motor.

One end of the coil spring 921 is attached to the center of the intermediate plate 920. The other end of the coil spring 921 is coupled to the lower surface of the wafer top plate 901 to support its weight. For this reason, the Z linear motor formed of the Z movable element (906, 907, or 908) and the Z stator (913, 914, or 915) need not generate a thrust for supporting the weight of the wafer top plate 901 but suffices if it generates a small force necessary for correcting a shift from the target position.

The coarse movement stage will be described with reference to FIG. 10 and FIGS. 11A and 11B.

The coarse movement stage is arranged below the intermediate plate 920. The intermediate plate 920 is fixed on an upper plate 921a of an X slider 921 of the coarse movement stage. In other words, the coarse movement stage moves over a long X-Y stroke the intermediate plate 920, serving as part of the fine movement stage and a base for receiving the reaction force of the linear motor that exerts a control force on the wafer top plate 901.

A Y yaw guide 923 is fixed on a base surface plate 922, and a Y slider 924 guided by the side surface of the Y yaw guide 923 and the upper surface of the base surface plate 922 is supported on the base surface plate 922 by an air slide (not shown) to be slidable in the Y direction. The Y slider 924 is mainly comprised of four members, i.e., two X yaw guides 924a, a front end member 924b, and a rear end member 924c. The rear end member 924c faces the side surface of the Y yaw guide 923 and the upper surface of the base surface plate 922 through air pads (not shown) provided to its side and lower surfaces. The front end member 924b faces the upper surface of the base surface plate 922 through an air pad (not shown) provided to its lower surface. Consequently, the Y slider 924 as a whole is supported by the side surface of the Y yaw guide 923 and the upper surface of the base surface plate 922 to be slidable in the Y direction, as described above.

The X slider 921 guided by the side surfaces of the two X yaw guides 924a, which are the constituent components of the Y slider 924, and the upper surface of the base surface plate 922 surrounds the Y slider 924 about the X-axis, and is supported by an air slide (not shown) to be slidable in the X direction. The X slider 921 is mainly comprised of four members, i.e., two X slider side plates 921b and the X slider upper and lower plates 921a and 921c. The X slider lower plate 921c faces the upper surface of the base surface plate 922 through an air pad (not shown) provided to its lower surface. The two X slider side plates 921b face the side surfaces of the two X yaw guides 924a, serving as the constituent members of the Y slider 924, through air pads (not shown) provided to their side surfaces. The lower surface of the X slider upper plate 921a does not come into contact with the upper surfaces of the X yaw guides 924a, and the upper surface of the X slider lower plate 921c does not come into contact with the lower surfaces of the X yaw guides 924a. Consequently, the X slider 921 as a whole is supported by the side surfaces of the two X yaw guides 924a and the upper surface of the base surface plate 922 to be slidable in the X direction, as described above. As a result, the X slider 921 is two-dimensionally slidable in the X-Y direction.

A driving mechanism will be described with reference to FIG. 10, FIGS. 11A and 11B, and FIG. 14. As the driving mechanism, one multi-phase coil switching long distance linear motor (stator 925a, movable element 927a) for X driving, and two multi-phase coil switching long distance linear motors (stators 925b and 925c, movable elements 927b and 927c) for Y driving are used. In these linear motors, as shown in FIG. 14, a stator 925 is formed by inserting a plurality of coils 926 arrayed in the stroke direction in a frame. A movable element 927 is formed by arranging a quadrupole magnet, having a magnetic pole pitch equal to the coil span of the coils 926, on a yoke plate 929. Two movable elements 927 each formed in this manner oppose each other to sandwich the coils 926, thus forming a box-like magnet unit. When a current is selectively supplied to the coils 926 of the stator 925 in accordance with the position of the movable element 927, a thrust is generated. Such a linear motor is a general air-core brushless DC linear motor.

The Y slider 924 is connected to the movable elements 927b and 927c through a front attaching plate 931 and rear attaching plate 930, respectively, and is moved upon movement of the movable elements 927b and 927c. As the X slider upper plate 921a and the movable element 927a (FIG. 11A) are connected to each other, the X slider 921 is moved upon movement of the movable element 927a. The X slider 921 and Y slider 924 have means for measuring the X and Y positions independently of the fine movement stage.

The function of the coarse movement stage is to receive the reaction force of the linear motor of the fine movement stage and to move the intermediate plate 920 to a portion in the vicinity of the target position constantly so the stroke of the linear motor of the fine movement stage is not used up. As the linear motor of the fine movement stage has a stroke of about 1 mm, the coarse movement stage does not perform control operation of particularly measuring the position relative to the fine movement stage and following it, but controls the position independently of the fine movement stage by means of a unique measurement system.

This method is excellent in the following respects. Namely, first, the X, Y and Z fine movement linear motors directly exert forces in six-axis directions on the fine movement top plate as the final control target. In other words, no indirect mechanical transfer elements are present for the fine movement top plate. Hence, the control range of the fine movement top plate can be set very high, and accordingly, the position control precision becomes very high.

Second, vibration from the floor is insulated by the X, Y, and Z fine movement linear motors. As described above, the fine movement linear motor utilizes the Lorentz force, so vibration of the stator is not transferred to the movable element.

The above arrangement realizes high-precision scanning exposure.

The conventional method described above has a problem in that heat generation by the linear motor is large.

First, as the linear motor of the coarse movement stage, a DC brushless linear motor is employed. This linear motor utilizes the Lorentz force, in the same manner as the fine movement linear motor. This linear motor is excellent in response speed and vibration insulating properties, but its heat generation obtained with the same thrust is large. When the linear motor of the coarse movement stage generates heat, ambient air fluctuates, leading to a measurement error of the interferometer. Alternatively, the acceleration may be limited in order to suppress heat generation.

Second, heat generation by the linear motor of the fine movement stage is large. The linear motor of the fine movement stage also utilizes the Lorentz force, and is excellent in response speed and vibration insulating properties, but its heat generation with the same thrust is large. Heat generation becomes an issue during acceleration and deceleration. In scanning exposure, acceleration is performed first. When the maximum speed is reached, exposure is performed while traveling at a constant speed. When exposure is ended, deceleration is performed. This process is repeated. During acceleration or deceleration, a thrust equal to "(the mass of the top plate) x acceleration" must be applied by the X fine movement linear motor when acceleration or deceleration is to be performed in the X direction. When acceleration or deceleration is to be performed in the Y direction, the above thrust must be applied by the Y fine movement linear motor. Therefore, during acceleration or deceleration, the linear motor generates heat to deform the wafer top plate 901. Alternatively, acceleration may be limited in order to suppress heat generation.

Namely, with the conventional method, the acceleration is limited due to heat generation by the coarse movement linear motor and the fine movement linear motor, leading to degradation in productivity.

SUMMARY OF THE INVENTION

The present invention has been made in view of the above problems, and has as its object to reduce heat generation by a linear motor serving for positioning in a stage apparatus.

According to the present invention, the foregoing object is attained by providing a stage apparatus comprising: a first stage having a first linear motor portion for moving a first table, to move the first table with respect to a base table by driving the first linear motor portion; a second stage having a second linear motor portion connected to the first table and a second table, to move the second table; and an electromagnetic coupling provided between the first and second tables to apply an accelerating force to the second table in accordance with acceleration or deceleration of the first linear motor.

According to another aspect of the present invention, the foregoing object is attained by providing a method of driving a stage apparatus including a first stage having a first linear motor portion connected to a first table, to move the first table with respect to a base table by driving the first linear motor portion, a second stage having a second linear motor portion connected to the first table and a second table, to move the second table, and an electromagnetic coupling provided between the first and second tables to apply an accelerating force to the second table, the method comprising: the movement control step of moving the second table by driving the first and second linear motor portions; and the driving step of driving the electromagnetic coupling in accordance with acceleration or deceleration operation by the first linear motor portion, thereby applying an accelerating force to the second table.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 1A and 1B are views showing the arrangement of a stage apparatus according to the first embodiment;

FIGS. 7A and 7B are views for describing the arrangement of a linear motor according to the second embodiment;

FIGS. 12A to 12C are views showing the arrangement of a fine movement stage portion in the wafer stage shown in FIG. 9;

FIGS. 15A and 15B are timing charts for explaining the driving operation of the X and Y driving linear motors for driving the X and Y sliders and the driving timing of the electromagnetic coupling.

DETAILED DESCRIPTION OF THE PREFERRED EMBODIMENTS

Preferred embodiments of the present invention will now be described in detail in accordance with the accompanying drawings.

<First Embodiment>

A stage apparatus according to the following embodiment is characterized in that it uses a linear motor with an iron core as a linear motor for driving a coarse movement stage, and that a fine movement stage is provided with an electromagnetic coupling which applies acceleration to a wafer top plate as required only during acceleration. More specifically, first, the linear motor for the coarse movement stage is changed from one with an air core which is disadvantageous in heat generation to one with an iron core which is advantageous in heat generation, so heat generation is suppressed. In a linear motor with an iron core, heat generation with the same thrust is small, but a large cogging force acts between the magnet and iron core. Hence, a linear motor with an iron core has not been used for a stage that requires precise control operation.

In view of this, seven linear motors utilizing the Lorentz force are provided between a coarse movement stage and a wafer top plate to form a fine movement stage. Even when the linear motors of the coarse movement stage have cogging and the position precision of the coarse movement table slightly degrades, the seven fine movement linear motors absorb the cogging to prevent degradation in position precision of the fine movement stage. Hence, linear motors with iron cores can be mounted. This alone, however, cannot yet solve the problem of heat generation by the linear motors of the fine movement stage during acceleration. To solve this problem, the fine movement stage is provided with an electromagnetic coupling which applies an accelerating force to the wafer top plate as required only during acceleration.

Figure 2C:
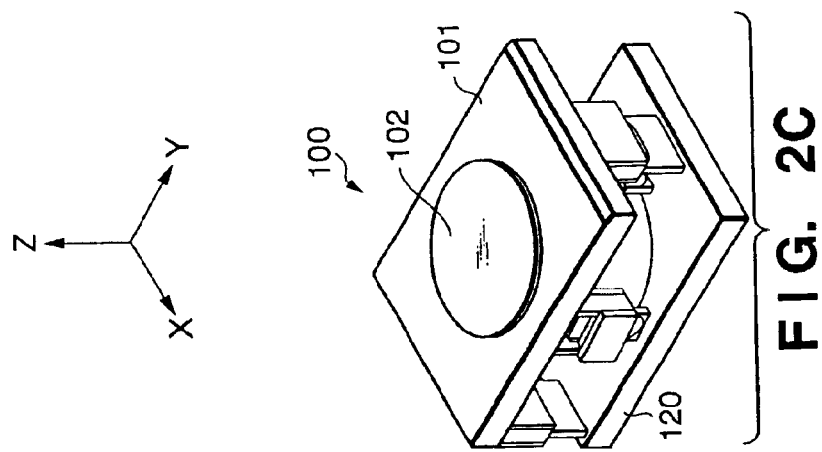
FIGS. 2A, 2B, and 2C are views showing in detail a fine movement stage in the stage apparatus shown in FIGS. 1A and 1B.
Figure 2B:
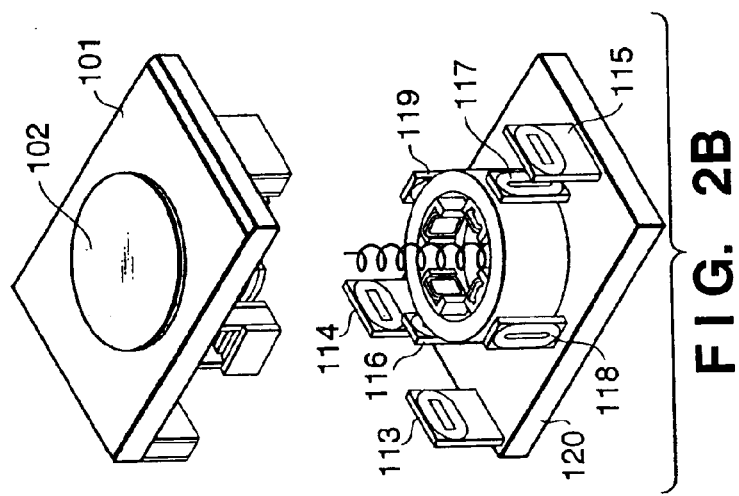
Figure 2A:
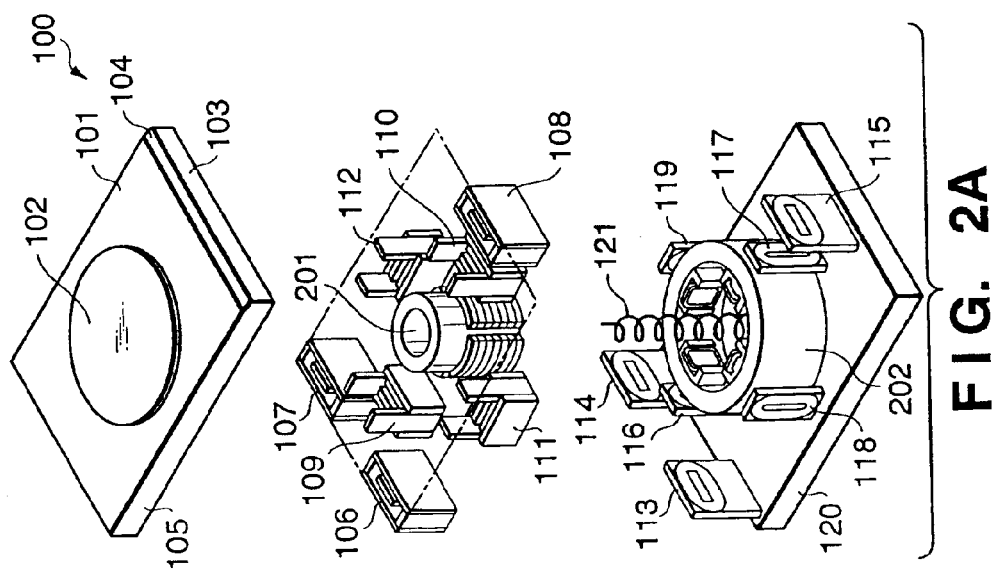
Figure 3B:
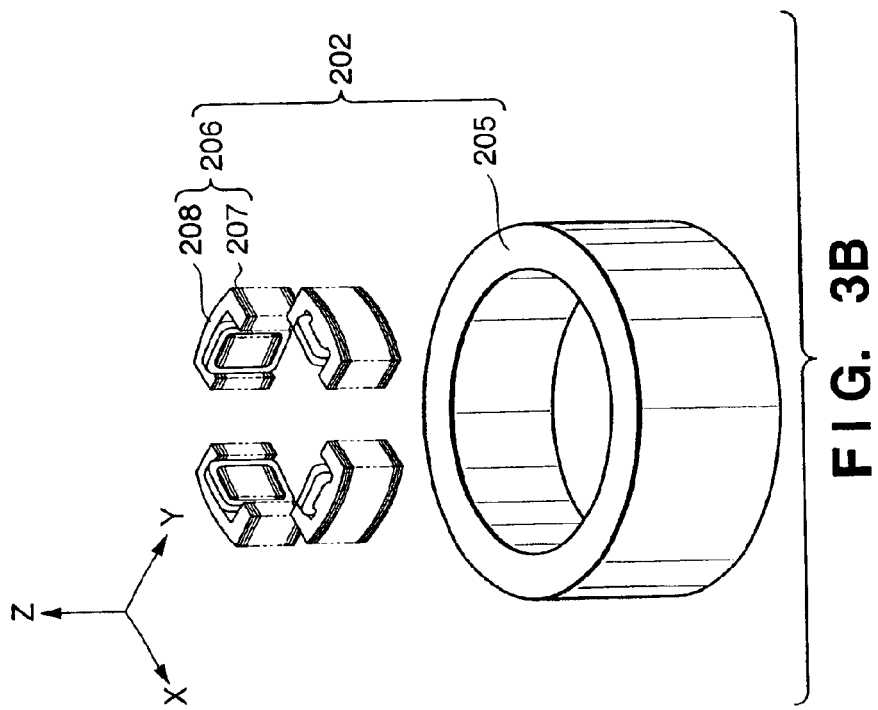
FIGS. 3A and 3B are views showing in detail an electromagnetic coupling provided to the fine movement stage.
Figure 3A:
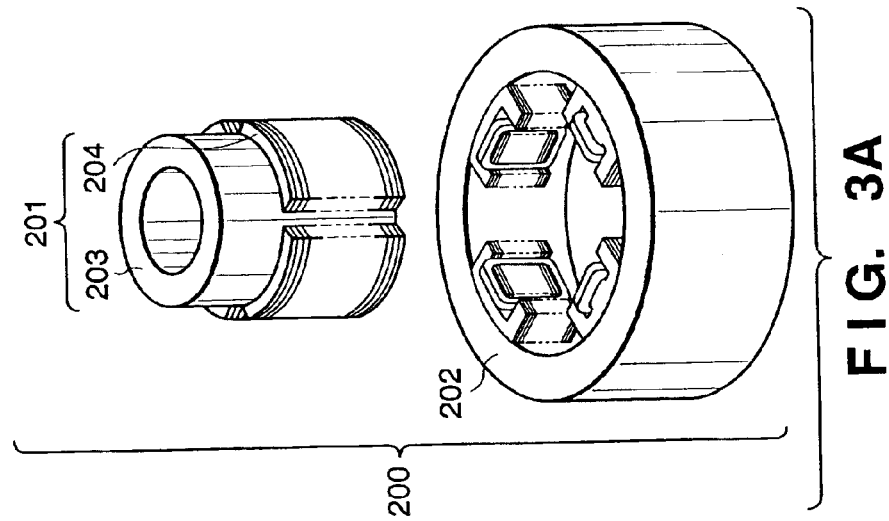
Figure 4A:
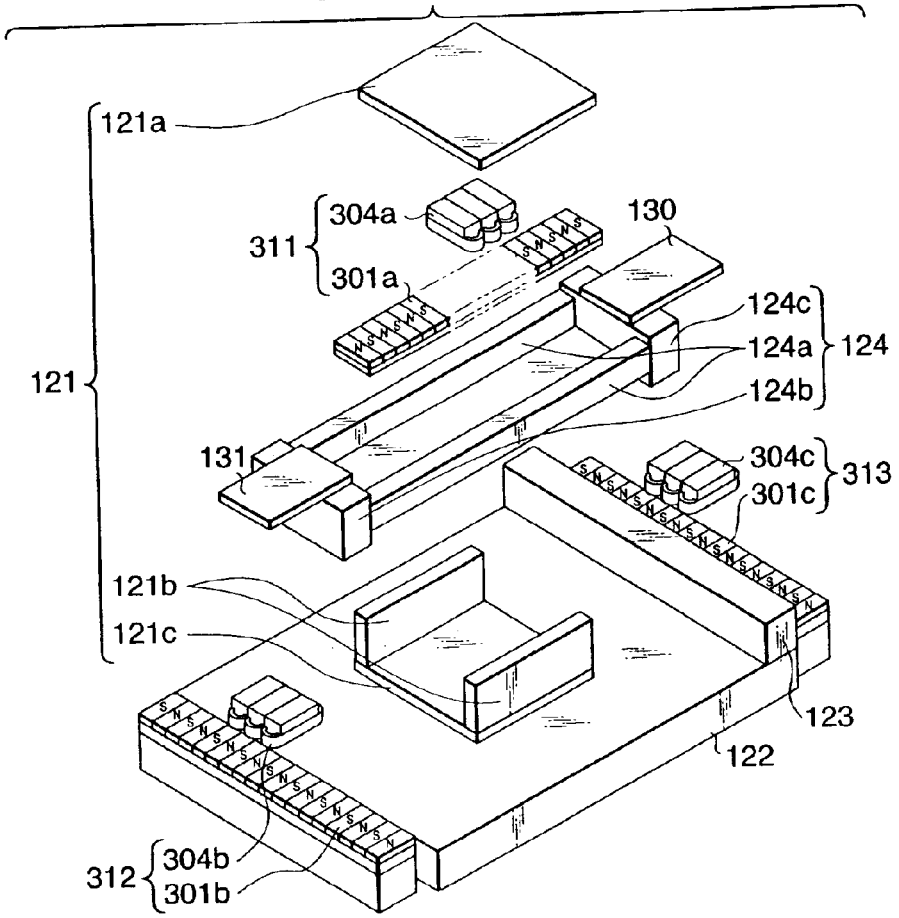
FIGS. 4A and 4B are views showing in detail a coarse movement stage in the stage apparatus of FIGS. 1A and 1B.
Figure 4B:
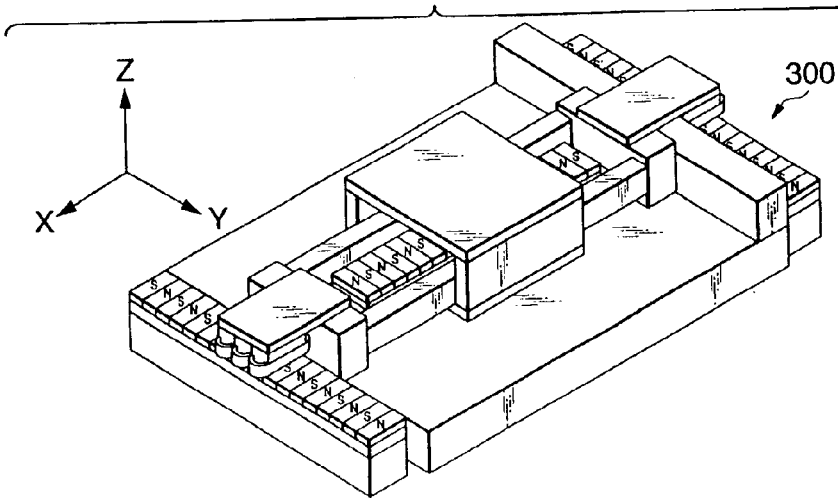
Figure 5:
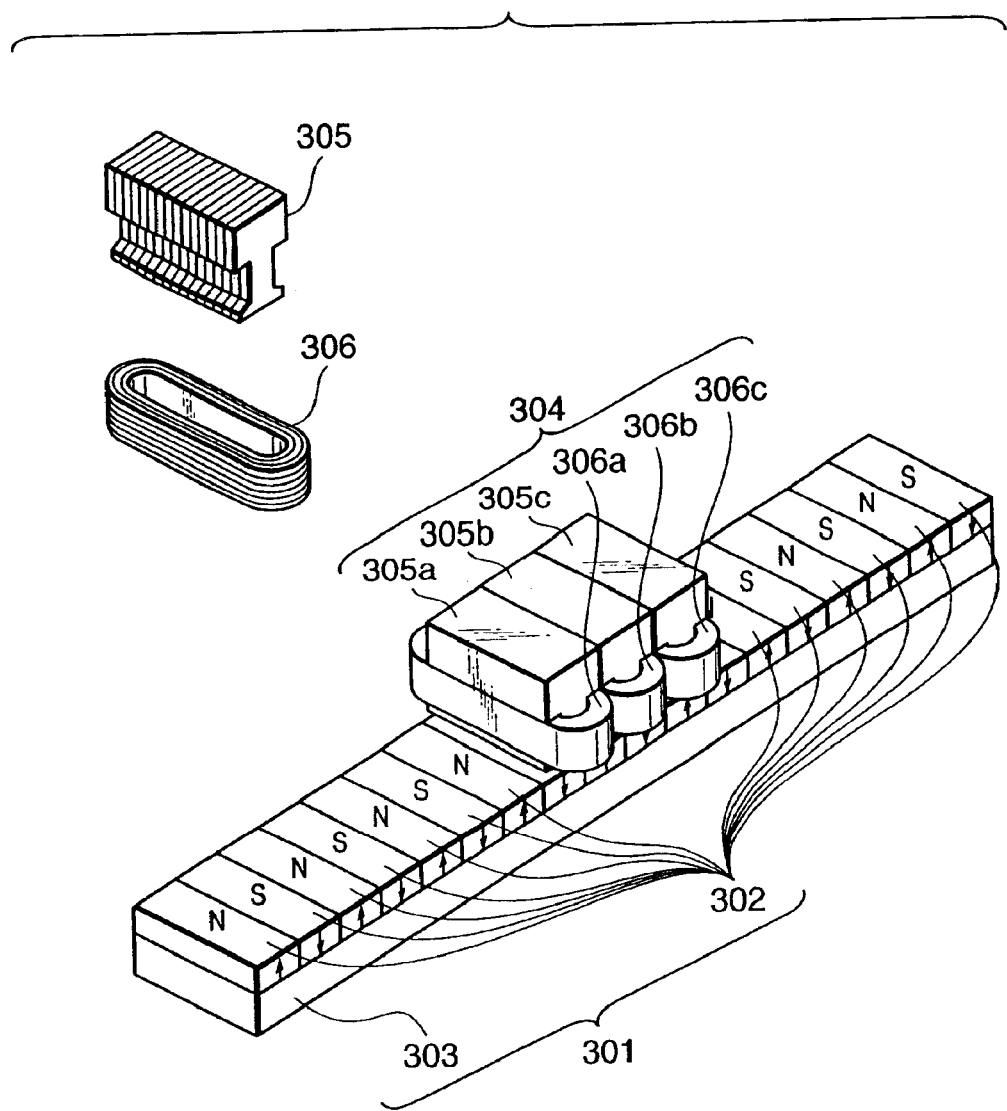
FIG. 5 is a view showing in detail a linear motor with an iron core which is used to drive a coarse movement stage in the stage apparatus of FIGS. 1A and 1B.

FIGS. 1A and 1B are views showing the arrangement of a stage apparatus according to the first embodiment. FIGS. 2A to 2C are views showing in detail a fine movement stage in the stage apparatus shown in FIGS. 1A and 1B. FIGS. 3A and 3B are views showing in detail an electromagnetic coupling provided to the fine movement stage. FIGS. 4A and 4B are views showing in detail a coarse movement stage in the stage apparatus of FIGS. 1A and 1B. FIG. 5 is a view showing in detail a linear motor with an iron core which is used to drive a coarse movement stage in the stage apparatus of FIGS. 1A and 1B.

FIG. 1A shows the entire stage apparatus, and FIG. 1B shows the coarse movement stage and fine movement stage separately. The arrangement of the coarse movement stage is the same as that of the conventional one except for linear motors. The arrangement of the fine movement stage is the same as that of the fine movement stage described in FIGS. 12A to 12C and FIGS. 13A to 13C except that it has an electromagnetic coupling.

The fine movement stage will be described first. As shown in FIGS. 2A to 2C, a wafer top plate 101 is a rectangular plate, and has a wafer chuck 102 at its center to place a wafer on it.

Mirrors 103 to 105 for reflecting laser beams from interferometers are provided to the side surface of the wafer top plate 101, so the position of the wafer top plate 101 can be measured. More specifically, the wafer top plate 101 is irradiated with a total of six light beams, so its six degree-of-freedom positions are measured. With two interferometer beams parallel to the X-axis and having different Z positions, the position in the X direction and the amount of rotation in the ωy direction can be measured. With three interferometer beams parallel to the Y-axis and having different X and Z positions, the position in the Y direction and the amount of rotation in the ωx and ωy directions can be measured. With beam irradiation to a C-surface portion (104) of the mirror, the position in the Z direction can be measured. In fact, the measurement values obtained with these beams are not independent of each other but interfere with each other. X, Y, Z, ωx, ωy, and ωz of a typical position can be measured by coordinate transformation as a rigid body.

Seven linear motor movable elements 106 to 112 are attached to the lower surface of the wafer top plate 101. As is described with reference to FIGS. 13A to 13C, each movable element has two sets of yokes and bipolar magnets magnetized in the direction of thickness. The two sets of magnets and yokes are connected to each other with side plates to form a box-like structure. The respective movable elements oppose each other to sandwich linear motor stators (to be described later) in a noncontact manner.

Of the seven movable elements, the three movable elements 106 to 108 arranged on the side ends of the rectangular top plate form Z movable elements. In the Z movable element, the bipolar magnets are arrayed in the Z direction, and mutually act with a current flowing through a Z stator elliptic coil (described later) with a straight portion perpendicular to the Z direction, thereby generating a thrust in the Z direction. These movable elements will be named Z1 to Z3 movable elements.

The four remaining movable elements 109 to 112 are arranged substantially at the center of the rectangular top plate. Of the four movable elements, the two movable elements 109 and 110 form X movable elements. In the X movable element, the bipolar magnets are arrayed in the X direction, and mutually act with a current flowing through an X stator elliptic coil (described later) with a straight portion perpendicular to the X direction, thereby generating a thrust in the X direction. These movable elements will be named X1 and X2 movable elements.

The two remaining movable elements 111 and 112 form Y movable elements. In the Y movable element, the bipolar magnets are arrayed in the Y direction, and mutually act with a current flowing through a Y stator elliptic coil (described later) with a straight portion perpendicular to the Y direction, thereby generating a thrust in the Y direction. These movable elements will be named Y1 and Y2 movable elements.

Seven linear motor stators 113 to 119 for position-controlling the wafer top plate 101 in the six-axis directions, and one end of a self-weight support spring 121 for supporting the weight of the wafer top plate 101 are fixed to the upper portion of an intermediate plate 120. The stators support the elliptic coils with peripheral frames, as is described with reference to FIGS. 13A to 13C, and face the linear motor movable elements 106 to 112 fixed to the lower surface of the wafer top plate 101 in a noncontact manner.

Figure 13A:
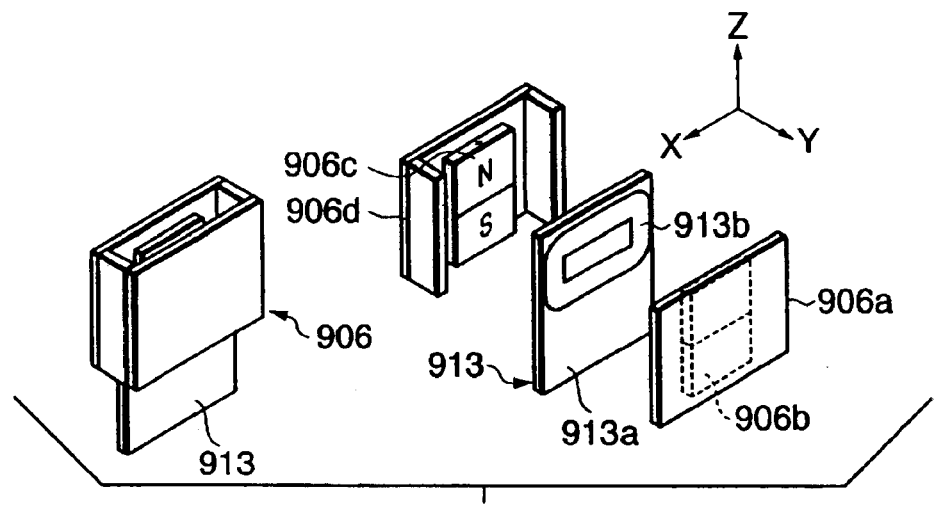
FIGS. 13A to 13C are views showing the arrangement of a fine movement stage linear motor used in the wafer stage shown in FIG. 9.

Of the seven stators, the three stators 113 to 115 arranged in the vicinities of the sides on the rectangular intermediate plate 120 form Z stators. In the Z stator, as shown in FIG. 13A, the elliptic coil is arranged such that its straight portion is perpendicular to the Z direction. Thus, the elliptic coil can exert a thrust in the Z direction on those bipolar magnets of the Z movable element which are arranged in the Z direction. These coils will be named Z1, Z2, and Z3 coils.

Figure 13B:
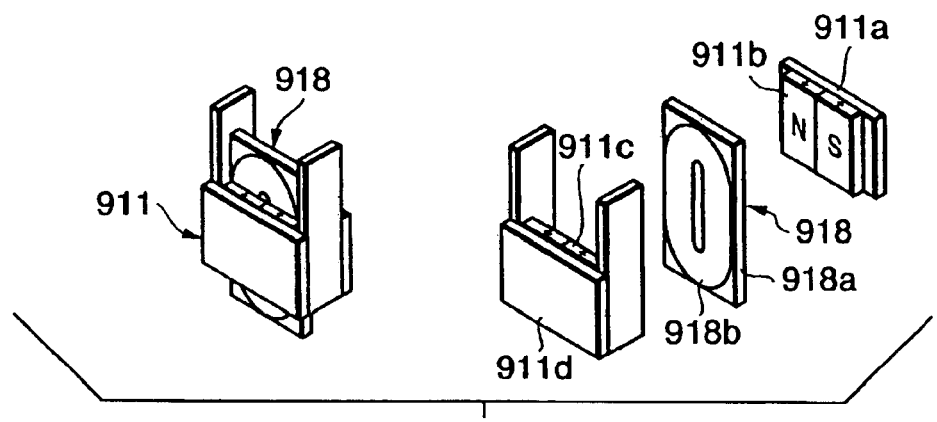
Figure 13C:
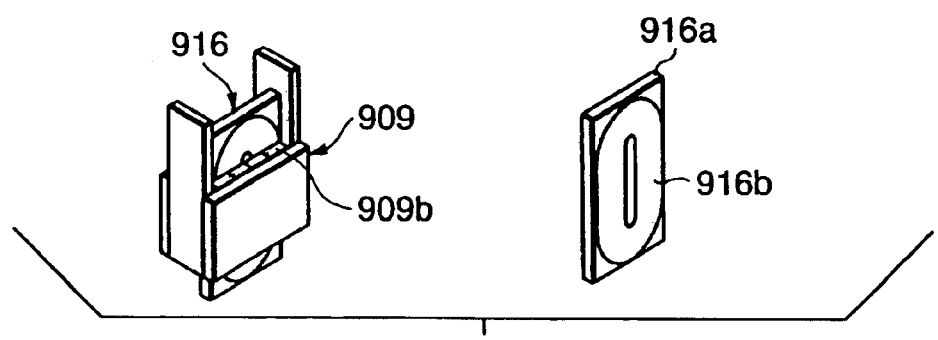
Figure 14:
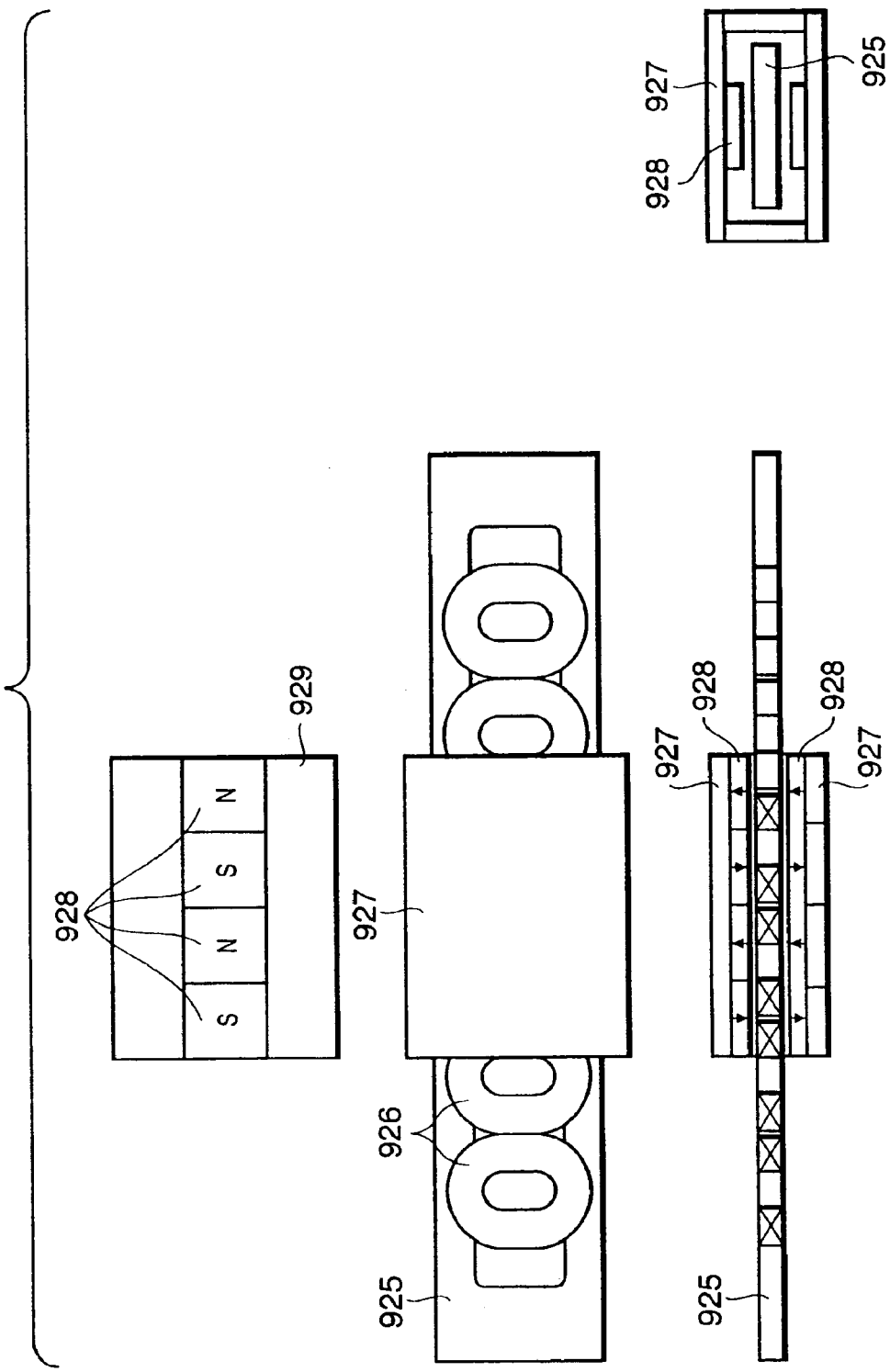
FIG. 14 is a view showing the arrangement of a coarse movement stage linear motor for the wafer stage shown in FIG. 9.

The four remaining stators 116 to 119 are arranged at the center of the intermediate plate 120. Of the four remaining stators, two form X stators 116 and 117. In the X stator, as shown in FIG. 13C, the two straight portions of an elliptic coil are perpendicular to the X direction. The two straight portions are arranged along the X direction. Thus, the elliptic coil can exert a thrust in the Z direction on those bipolar magnets of the X movable element which are arranged along the X direction. These coils will be named X1 and X2 coils.

The two remaining stators are also arranged at the center of the intermediate plate and form Y stators 118 and 119. In the Y stator, as shown in FIG. 13B, the two straight portions of the elliptic coil are perpendicular to the Y direction. The two straight portions are arranged along the Y direction. Thus, the elliptic coil can exert a thrust in the Y direction on those bipolar magnets of the Y movable element which are arranged along the Y direction. These coils will be named Y1 and Y2 coils.

These seven linear motors generate a thrust in accordance with the so-called Lorentz force. In the following description, a linear motor formed of a Z stator and a Z movable element will be referred to as a Z fine movement linear motor, a linear motor formed of an X stator and an X movable element will be referred to as an X fine movement linear motor, and a linear motor formed of a Y stator and a Y movable element will be referred to as a Y fine movement linear motor.

One end of the coil spring 121 is attached to the center of the intermediate plate 120. The other end of the coil spring 121 is coupled to the lower surface of the wafer top plate 101 to support its weight. For this reason, the Z fine movement linear motor described above, which is formed of the Z movable element and the Z stator need not generate a thrust for supporting the weight of the wafer top plate 101 but suffices if it generates a small force necessary for correcting a shift from the target position.

The above arrangement is the same as that of the fine movement stage shown in FIGS. 12A to 12C, but this embodiment has an electromagnetic coupling to be described later.

As shown in FIGS. 3A and 3B, an electromagnetic coupling 200 is comprised of an electromagnetic coupling movable element 201 and electromagnetic coupling stator 202. The electromagnetic coupling movable element 201 is connected to the wafer top plate 101, and the electromagnetic coupling stator 202 is connected to the intermediate plate 120. When the coarse movement stage is to be accelerated or decelerated, the electromagnetic coupling stator 202 generates an attractive force as required to the electromagnetic coupling movable element 201.

The electromagnetic coupling movable element 201 will be described. A cylindrical yoke attaching tube 203 is formed at substantially the center of the rectangular lower surface of the wafer top plate 101. Four arcuate I-section yokes 204 are fixed to the outer portion of the yoke attaching tube 202 serving as a magnetic support cylinder. Of the four I-section yokes 204, two are arranged along the X direction, and face E-shaped electromagnets 206 (to be described later) arranged also along the X direction in a noncontact manner, to receive a large attractive force in the X direction from them. These I-section yokes arranged along the X direction will be named X1 and X2 yokes.

The two remaining I-section yokes are arranged along the Y direction, and face other E-shaped electromagnets 206 (to be described later) arranged also along the Y direction in a noncontact manner, to receive a large attractive force in the Y direction from them. These I-section yokes will be named Y1 and Y2 yokes.

The electromagnetic coupling stator 202 will be described. An electromagnet attaching tube 205 is formed at the center of the intermediate plate 120, and the four E-shaped electromagnets 206 are formed in the cylinder of the electromagnet attaching tube 205. Each E-shaped electromagnet 206 is comprised of an E-section yoke 207 having an almost E-shaped section when seen from above, and a coil 208. The coil 208 is wound on the central projection of the letter E. The end faces of the three projections of the letter E are not straight but arcuate, and face the corresponding arcuate I-section yoke 204 fixed to the wafer top plate 101 through a gap of about several 10 $\mu$m or more in a noncontact manner. When a current is supplied to the coil 208, the coil 208 applies an attractive force to the corresponding I-section yoke 204.

Of the E-shaped electromagnets 206, two are arranged along the X direction to face the X1 and X2 yokes described above, and apply attractive forces in the X and −X directions to them. These E-shaped electromagnets 206 will be named X1 and X2 electromagnets. Similarly, the two remaining ones of the E-shaped electromagnets 206 are arranged along the Y direction to face the Y1 and Y2 yokes, and apply attractive forces in the Y and −Y directions to them. These E-shaped electromagnets 206 will be named Y1 and Y2 electromagnets.

The E-shaped electromagnets 206 can generate only the attractive force. Hence, an electromagnet for generating an attractive force in the + direction and an electromagnetic for generating an attractive force in the − direction are provided in each of the X and Y driving directions.

The I-section yokes 204 form arcs around the Z-axis, and the end faces of the letters E of the E-shaped electromagnets 206 form arcs around the Z-axis. Thus, the four magnetic blocks (I-section yokes) and the four E-shaped electromagnets can rotate freely about the Z-axis freely without coming into contact with each other. Also, the gap does not change upon rotation, and the attractive force generated by the electromagnet by the same current does not change.

The I-section yokes 204 and E-section yoke 207 are formed by stacking thin plates electrically insulated from each other, and prevent an eddy current from flowing in the yokes upon a change in magnetic flux. Hence, the attractive force can be controlled up to a high frequency.

The acting position of the attractive force of the electromagnetic coupling 200 will be described.

The Z-coordinates of the lines of action of the forces generated by the X1 and X2 electromagnets almost coincide with each other. These Z-coordinates almost coincide with the Z-coordinate of the barycenter of the wafer top plate 101 including the X1 and X2 movable elements (109 and 110), the Y1 and Y2 movable elements (111 and 112), the Z1 to Z3 movable elements (106 to 108), the yoke attaching tube 203, and the four arcuate I-section yokes 204. Therefore, the rotation force about the X-axis generated by the thrust in the Y direction applied to the Y1 and Y2 movable elements does not substantially act on the wafer top plate 101.

The Z-coordinates of the lines of action of the forces generated by the Y1 and Y2 electromagnets almost coincide with each other. These Z-coordinates almost coincide with the Z-coordinate of the barycenter of the wafer top plate 101 including the X1 and X2 movable elements (109 and 110), the Y1 and Y2 movable elements (111 and 112), the Z1 to Z3 movable elements (106 to 108), the yoke attaching tube 203, and the four arcuate I-section yokes 204. Therefore, the rotation force about the X-axis generated by the thrust in the Y direction applied to the Y1 and Y2 movable elements does not substantially act on the wafer top plate 101.

The Y-coordinates of the lines of action of the attractive forces in the X direction generated by the X1 and X2 electromagnets almost coincide with the Y-coordinate of the barycenter of the wafer top plate 101 including the X1 and X2 movable elements (109 and 110), the Y1 and Y2 movable elements (111 and 112), the Z1 to Z3 movable elements (106 to 108), the yoke attaching tube 203, and the four arcuate I-section yokes 204. Therefore, the rotation force about the Z-axis generated by the attractive force in the X direction applied to the X1 and X2 yokes, among the I-section yokes 204, does not substantially act on the wafer top plate 101.

The X-coordinates of the lines of action of the attractive forces in the Y direction generated by the Y1 and Y2 electromagnets almost coincide with the Z-coordinate of the barycenter of the wafer top plate 101 including the X1 and X2 movable elements (109 and 110), the Y1 and Y2 movable elements (111 and 112), the Z1 to Z3 movable elements (106 to 108), the yoke attaching tube 203, and the four arcuate I-section yokes 204. Therefore, the rotation force about the Z-axis generated by the attractive force in the Y direction applied to the Y1 and Y2 yokes, among the I-section yokes 204, does not substantially act on the wafer top plate 101.

The characteristic feature of the E-shaped electromagnets of the electromagnetic coupling will be described.

The first characteristic feature is the occasionality of the attractive force and the vibration insulation properties. An electromagnet generates an attractive force only when a current is supplied to it, and does not generate any force at all or transfer vibration when no current is supplied to it. Accordingly, if a current is supplied to the coils 208 of the E-shaped electromagnets 206 only during acceleration and deceleration of the stage, no attractive force is generated during scanning that requires precise position control, and the electromagnets do not adversely affect the precision at all.

FIGS. 15A and 15B are timing charts for explaining the driving operation of X and Y driving linear motors (to be described later) and the driving operation of the electromagnetic coupling 200 according to this embodiment. As shown in FIGS. 15A and 15B, the X1 an X2 electromagnets of the electromagnetic coupling 200 are driven only during acceleration or deceleration that occurs when starting or stopping the X driving linear motor. Similarly, the Y1 and Y2 electromagnets of the electromagnetic coupling 200 are driven only during acceleration or deceleration that occurs when starting or stopping the Y driving linear motor. More specifically, when the acceleration of the slider is large, control operation is performed, for example, and the current flowing through the coils of the electromagnetic coupling is increased in accordance with the large acceleration.

The second characteristic feature is small heat generation. As the gap between the E-shaped electromagnets 206 and I-section yokes 204 is as small as about several 10 $\mu$m, a large force can be generated with a very small current. This may also be because d$\phi$/dx is set as large as possible at the sacrifice of the stroke. Hence, even when an attracting force necessary for acceleration is generated, heat generation is very small, and thermal deformation does not become an issue.

With the above arrangement, on a fine movement stage 100, thrusts in six-axis directions can be applied to the wafer top plate 101 by the linear motors, and a large attracting force in the X-Y direction can be applied by the electromagnetic coupling 200.

While the wafer top plate 101 need not be moved over a long stroke in the Z, ωx, ωy, and ωz directions, thrusts and attractive forces must act over a long stroke in the X-Y direction. However, both the linear motors and electromagnets have very short strokes in the X-Y direction. Regarding this, the X slider has a long stroke in the X-Y direction. The movable portions of the linear motors and electromagnets are fixed to the top plate, and the stationary portions of the linear motors and electromagnets are fixed to the X slider. The X slider to which the stationary portions of the linear motors and electromagnets are fixed is moved in the X-Y direction. During the movement in the X-Y direction, thrusts and attractive forces in the X-Y direction are exerted on the wafer top plate 101. Thus, the thrusts and attractive forces in the X-Y direction act on the wafer top plate 101 over a long distance in the X-Y direction.

A coarse movement stage 300 will be described.

The basic arrangement is the same as that of the conventional coarse movement stage. The coarse movement stage 300 is arranged below the intermediate plate 120. The intermediate plate 120 is fixed on an upper plate 121*a* of an X slider 121 of the coarse movement stage 300. In other words, the coarse movement stage 300 moves over a long X-Y stroke the intermediate plate 120 serving as part of the fine movement stage 100 and a base for receiving the reaction force of the linear motor that exerts a control force on the wafer top plate 101.

A Y yaw guide 123 is fixed on a base surface plate 122, and a Y slider 124 guided by the side surface of the Y yaw guide 123 and the upper surface of the base surface plate 122 is supported above the base surface plate 122 by an air slide (not shown) to be slidable in the Y direction. The Y slider 124 is mainly comprised of four members, i.e., two X yaw guides 124*a*, a front end member 124*b*, and a rear end member 124*c*. The rear end member 124*c* faces the side surface of the Y yaw guide 123 and the upper surface of the base surface plate 122 through air pads (not shown) provided to its side and lower surfaces. The front end member 124*b* faces the upper surface of the base surface plate 122 through an air pad (not shown) provided to its lower surface. Consequently, the Y slider 124 as a whole is supported by the side surface of the Y yaw guide 123 and the upper surface of the base surface plate 122 to be slidable in the Y direction, as described above.

The X slider 121 guided by the side surfaces of the two X yaw guides 124*a*, which are the constituent components of the Y slider 124, and the upper surface of the base surface plate 122 surrounds the Y slider 124 about the X-axis, and is supported by an air slide (not shown) to be slidable in the X direction. The X slider 121 is mainly comprised of four members, i.e., two X slider side plates 121*b*, the X slider upper plate 121*a*, and an X slider lower plate 121*c*. The X slider lower plate 121*c* faces the upper surface of the base surface plate 122 through an air pad (not shown) provided to its lower surface. The two X slider side plates 121*b* face the side surfaces of the two X yaw guides 124*a*, serving as the constituent members of the Y slider 124, through air pads (not shown) provided to their side surface. The lower surface of the X slider upper plate 121*a* does not come into contact with the upper surfaces of the X yaw guides 124*a*, and the upper surface of the X slider lower plate 121*c* does not come into contact with the lower surfaces of the X yaw guides 124*a*. Consequently, the X slider 121 as a whole is supported by the side surfaces of the two X yaw guides 124*a* and the upper surface of the base surface plate 122 to be slidable in the X direction, as described above. As a result, the X slider 121 is two-dimensionally slidable in the X-Y direction.

As a driving mechanism for the coarse movement stage 300, one movable-coil long-distance linear motor for X driving and two movable-coil long-distance linear motors for Y driving are used. FIG. 5 shows the driving mechanism in detail.

A stator 301 is formed by fixing a plurality of magnets 302 arrayed in the stroke direction on a yoke 303. The magnets 302 are plate-like rectangular magnets magnetized in the vertical direction. The magnets 302 are arranged such that their poles opposing the stator 301 are N, S, N, S, . . . , alternately. The yoke 303 serves to circulate the magnetic fluxes of the magnets 302.

A movable element 304 is comprised of three yokes (A- to C-phase yokes 305*a* to 305*c*) and three coils (A- to C-phase coils 306*a* to 306*c*) wound on them. Each yoke 305 is formed by stacking thin plates electrically insulated from each other, and reduces an eddy current generated by the movement of the yoke 5 and that of the stator relative to each other. The typical positions of the three yokes are set such that they are shifted from each other by 120° when converted into the periods of the magnets of the stator.

Figure 10:
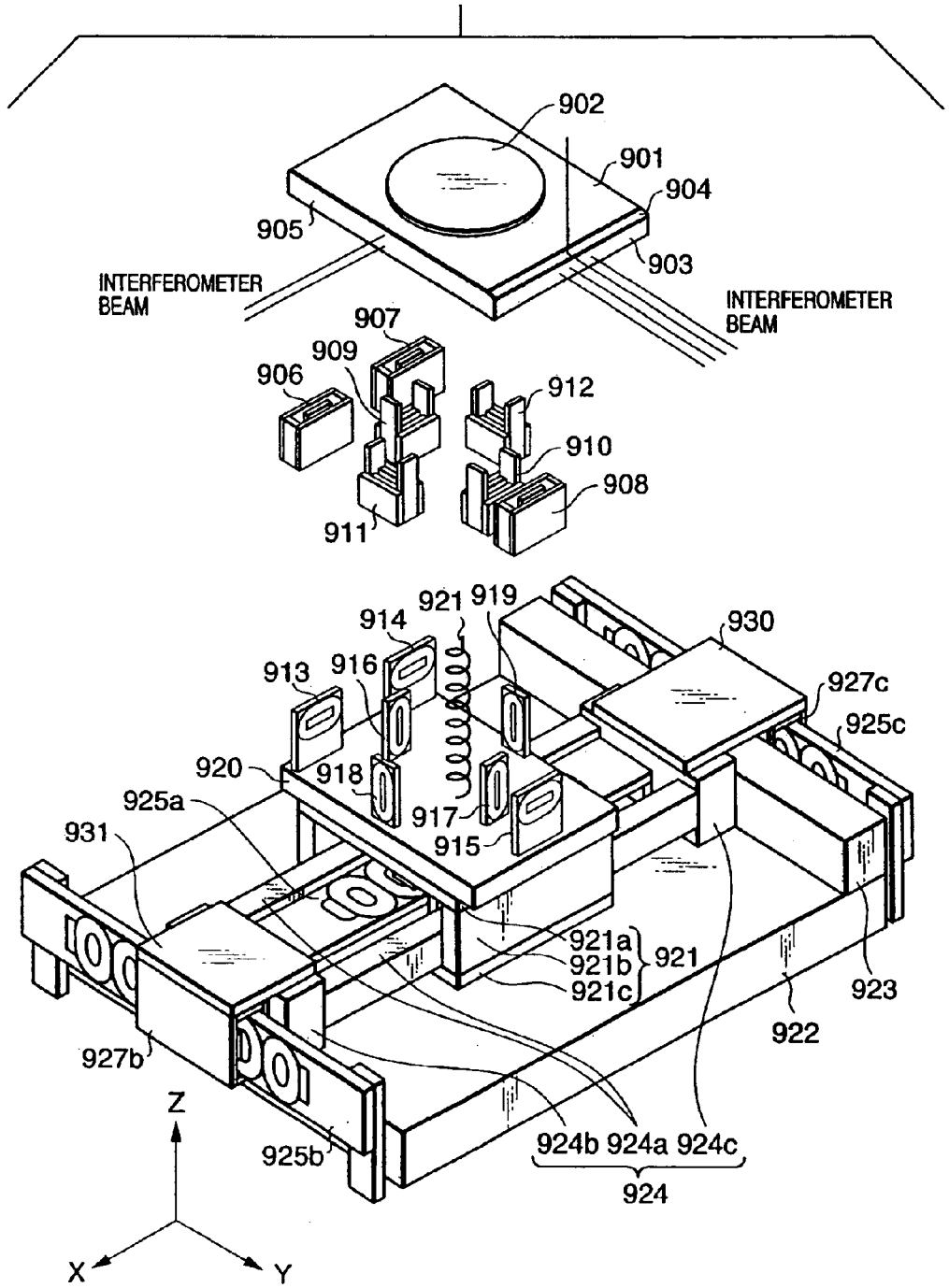
FIG. 10 is an exploded view showing the structure of the wafer stage shown in FIG. 9.
Figure 11A:
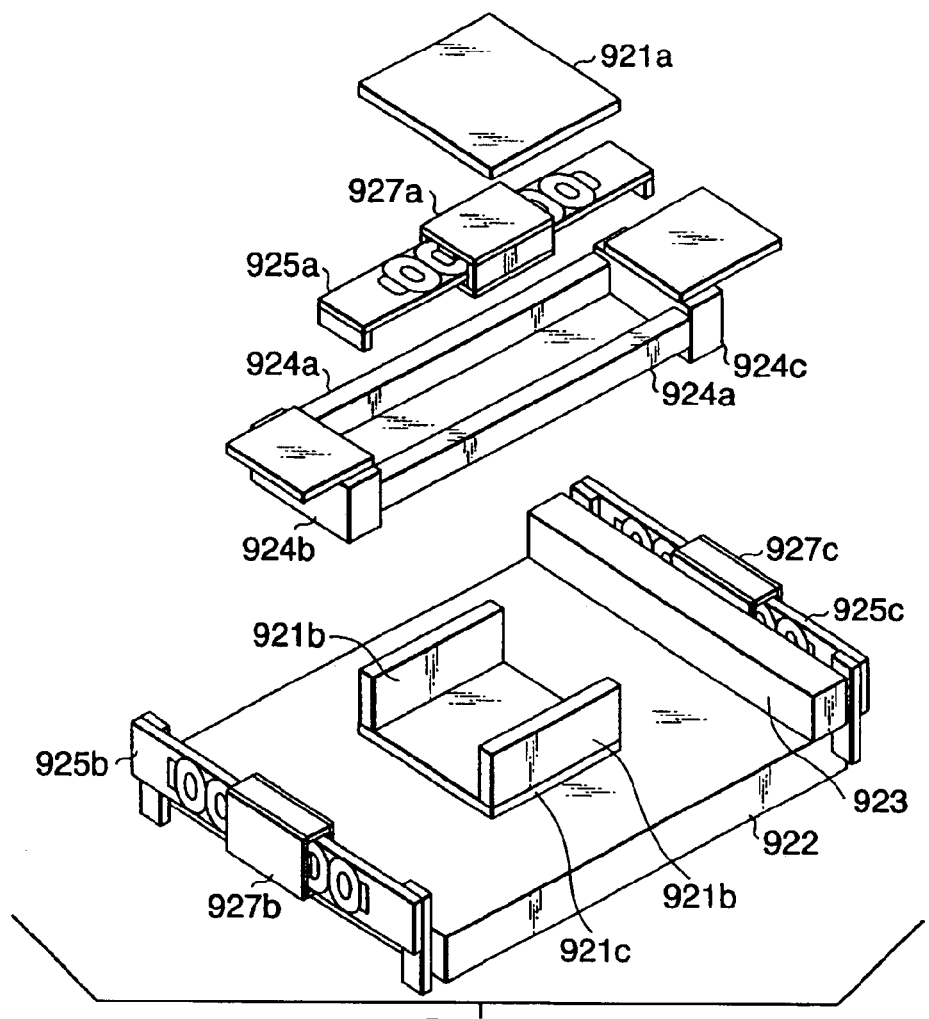
FIGS. 11A and 11B are views showing the arrangement of a coarse movement stage portion in the wafer stage shown in FIG. 9.
Figure 11B:
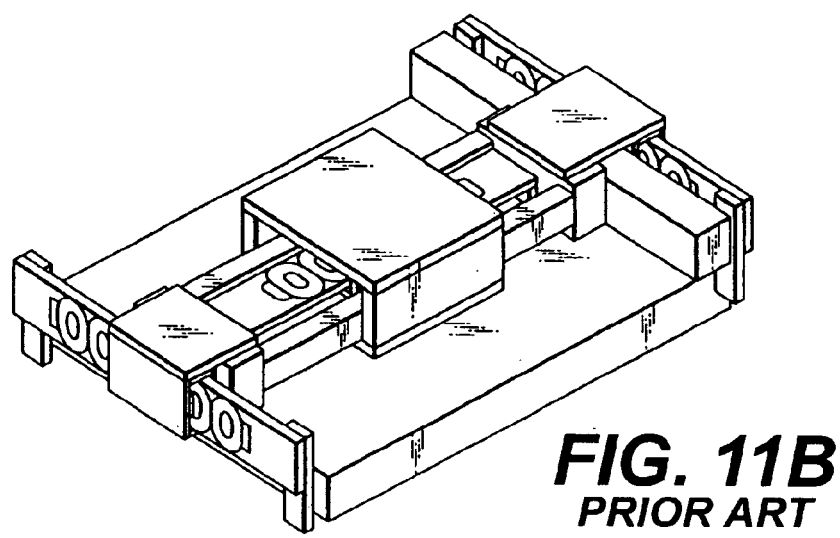

The air gap between the yokes 305 and magnets 302 is about 1 mm or less, which is $\frac{1}{10}$ to $\frac{1}{20}$ the air gap between the magnets shown in the prior art. Thus, large magnetic fluxes can be obtained that are linked to the coils. As the coil space can be large regardless of the air gap, the coil resistance for the same ampere turn can be reduced. The thrust is proportional to the product of the magnitude of the magnetic flux and the ampere turn, and heat generation is proportional to the coil resistance. Thus, heat generation obtained with the same thrust is much smaller than that in the linear motor with the conventional arrangement described with reference to, e.g., FIG. 10.

An X driving linear motor 311, and Y driving linear motors 312 and 313 are formed of stators 301*a*, 301*b*, and 301*c* and movable elements 304*a*, 304*b*, and 304*c* shown in FIG. 4A. The upper surface of the movable element 304*a* is connected to the lower surface of the X slider upper plate 121*a*, to move the X slider in the X direction. The movable elements 304*b* and 304*c* are connected to a front attaching plate 131 and rear attaching plate 130, respectively, of the Y slider 124, and move in the Y direction.

In the above embodiment, control operation is performed so as to supply a current, shifted from the phase of the magnetic flux linked to each yoke by 90°, to the three yokes 305*a* to 305*c* in accordance with their positions relative to the stator 301. In other words, control operation is performed so the current and the phase of the magnetic flux are orthogonal, thereby generating a thrust. In this example, description is made with three-phase driving, but the number of phases is arbitrary.

The characteristic feature of the linear motor of this type is a large cogging force. Degradation in position precision of the coarse movement stage caused by the large cogging force is absorbed by the fine movement linear motors of the fine movement stage 100, so the precision of the wafer top plate 101 does not degrade.

As described above, since the driver of the coarse movement stage is linear motors with iron cores, heat generation of the coarse movement stage during acceleration and deceleration does not substantially become an issue. During acceleration and deceleration, a force necessary for acceleration is applied to the wafer top plate 101 by the electromagnetic coupling 200, but the electromagnet itself of the electromagnetic coupling 200 does not substantially generate heat. As the fine movement linear motors do not generate accelerating or decelerating force, their heat generation does not become an issue either. Therefore, while the wafer top plate 101 maintains high control precision by means of direct control with the fine movement linear motors in the six-axis directions, heat generation during acceleration and deceleration can be reduced. Hence, acceleration of stage movement can be increased, thereby improving the productivity.

<Second Embodiment>

The second embodiment will be described. According to the second embodiment, in a driving linear motor for a coarse movement stage, a coil is provided to a stator. This stage arrangement and linear motor reduce the weight of the movable element, and accordingly reduce the weights of the X and Y sliders, thereby further reducing heat generation by the linear motor during driving.

Figure 6B:
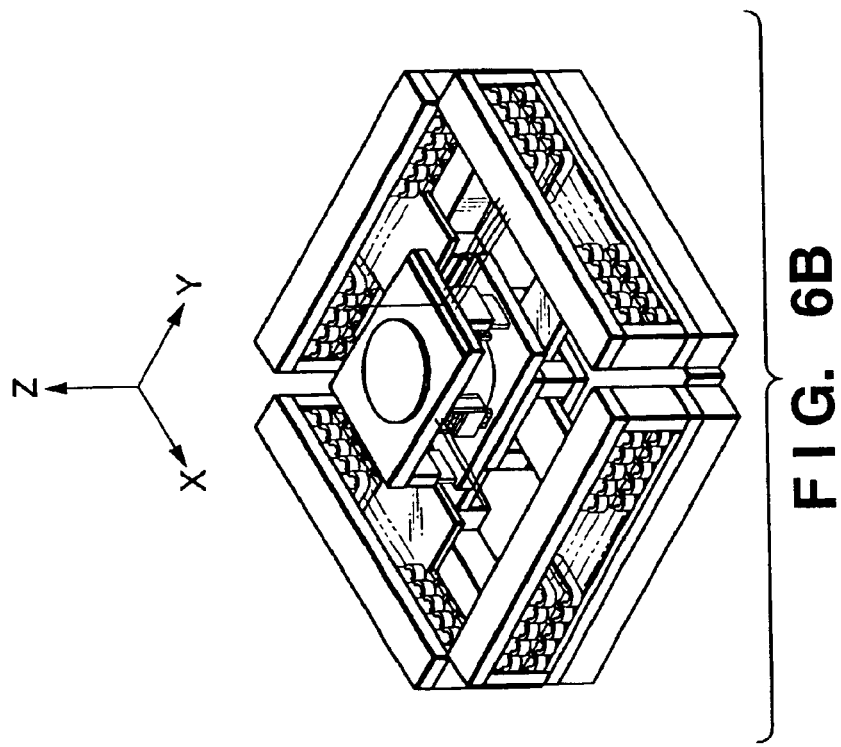
FIGS. 6A and 6B are views showing the arrangement of a stage apparatus according to the second embodiment.
Figure 6A:
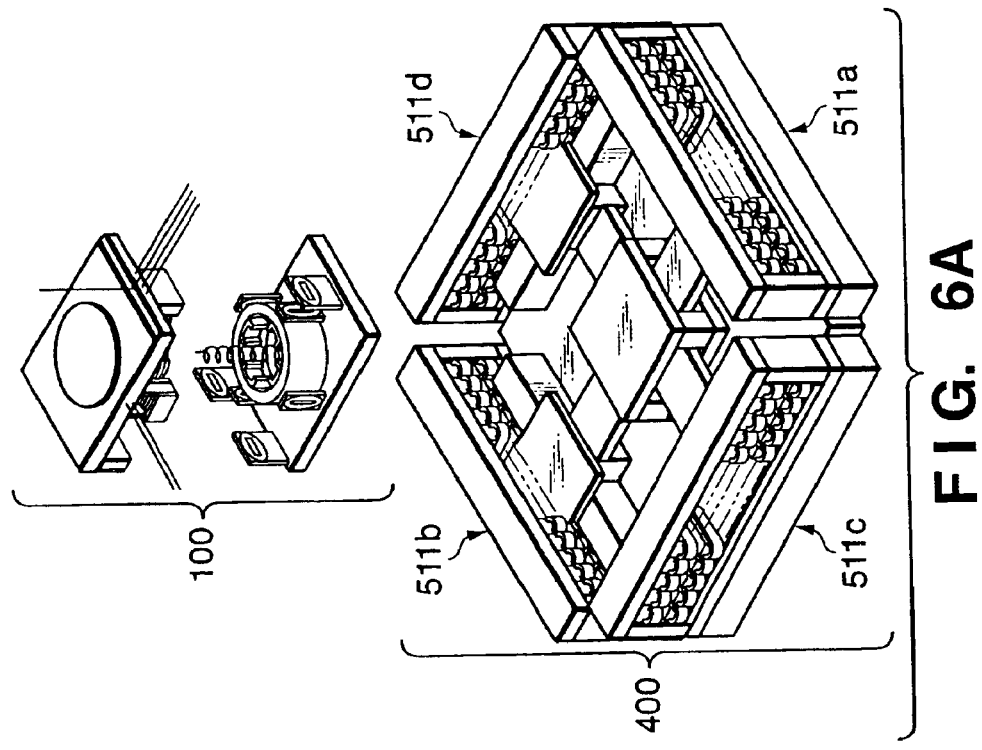

FIGS. 6A and 6B show the arrangement of a stage apparatus according to the second embodiment. FIG. 6A shows a coarse movement stage and a fine movement stage separately. A fine movement stage 100 is completely the same as that of the first embodiment, so a description will be made of only the coarse movement stage hereinafter.

A linear motor used for driving the coarse movement stage according to the second embodiment will be described. FIGS. 7A and 7B are views for describing the arrangement of the linear motor according to the second embodiment. In the second embodiment, a movable magnet type linear motor is used. A movable element 501 is comprised of magnets 502 and a magnet attaching plate 503. The magnets 502 are plate-like rectangular magnets magnetized in the vertical direction. The magnets 502 are arranged in a grouping of six such that their poles facing a stator 511 are N, S, N, S, . . . , alternately. These magnets 502 are integrally fixed on the slider of the coarse movement slider (to be described later) by means of the magnet attaching plate 503.

In the stator 511, units 515 and 517, each formed by integrally fixing fifteen yokes 512 and fifteen coils 513 wound on them with an upper plate 514 or a lower plate 516, sandwich movable element 501 vertically. The upper unit 515 and lower unit 517 are positioned and fixed by side plates 518. The integrated upper and lower units 515 and 517 are attached to the apparatus through a bed plate 519. The individual yokes and coils are completely the same as those of the first embodiment.

The fifteen yokes of each of the upper and lower units 515 and 517 are arranged such that the adjacent ones are shifted from each other by 120° when converted into the periods of the magnets 502 of the movable element 501. Consequently, every three yokes form the same phase array as the periods of the magnets. In other words, there are only three types of phases. These phases are shown in FIG. 7A as A, B, and C phases. The upper and lower facing yokes are arranged such that they have the same phase. Hence, the number of types of the phases is three, i.e., A, B, and C phases, for both the upper and lower units 515 and 517.

The upper and lower units 515 and 517 sandwich the movable magnets 502, thereby canceling the attractive forces acting on the movable magnets 502 and the yokes 512 of the stator 511. The gap between the movable element 501 and stator 511 is set to about 1 mm or less in the vertical direction.

The driving method is basically the same as that of the first embodiment. The thrust is generated by controlling the phases of the current and those of the magnetic fluxes to be orthogonal. The A-, B-, or C-phase current is controlled in accordance with the phase of the magnet. This is the same as in the first embodiment. The second embodiment is different from the first embodiment in that a coil to be driven is selected in accordance with the position of the magnet. According to the arrangement shown in FIGS. 7A and 7B, to drive all of the A-, B-, and C-phase coils is a waste since coils and yokes not facing the magnets do not contribute to the thrust. Therefore, the A-, B-, or C-phase coil which contributes to the thrust is selectively driven in accordance with the position of the movable magnet 502.

The advantage of the linear motor of this method is that the weight of the movable element can be reduced to be smaller than that of the first embodiment and that heat generation obtained with the same thrust can be reduced to be lower than that in the first embodiment. The only movable elements are the magnets, and the attaching plate may be a lightweight one made of aluminum or the like. Regarding the stator, even when the coils and yokes are designed in the same manner as those of the first embodiment, an ampere turn simply twice that of the first embodiment can be obtained. According to this supposition, the thrust becomes twice. The resistance also becomes twice. As heat generation is inversely proportional to the square of the thrust and proportional to the resistance, total heat generation obtained when the same thrust occurs becomes half. In other words, weight reduction and reduction of heat generation obtained when the same thrust is generated can be achieved simultaneously.

The linear motor of this method is inferior to that of the first embodiment in that the mass of the stator increases. This is because this method is based on the basic policy of reducing and increasing the weight of the movable element and stator, respectively, by disturbing the mass balance between the movable element and stator, and gaining the ampere turn with the stator. Hence, the increase in the mass of the stator is inevitable.

If the linear motor of this method is directly mounted on the stage with the structure of the first embodiment, a heavy stator is mounted on the Y slider. The mass of the entire Y slider increases, the thrust for accelerating the entire Y slider increases, and accordingly, heat generation by the linear motor for Y driving increases undesirably.

In view of this, according to the second embodiment, the structure of the coarse movement stage is devised. The drawback that the stator becomes heavy is overcome by combination with a coarse movement stage with a structure to be described hereinafter. The coarse movement stage according to the second embodiment will now be described.

Figure 8A:
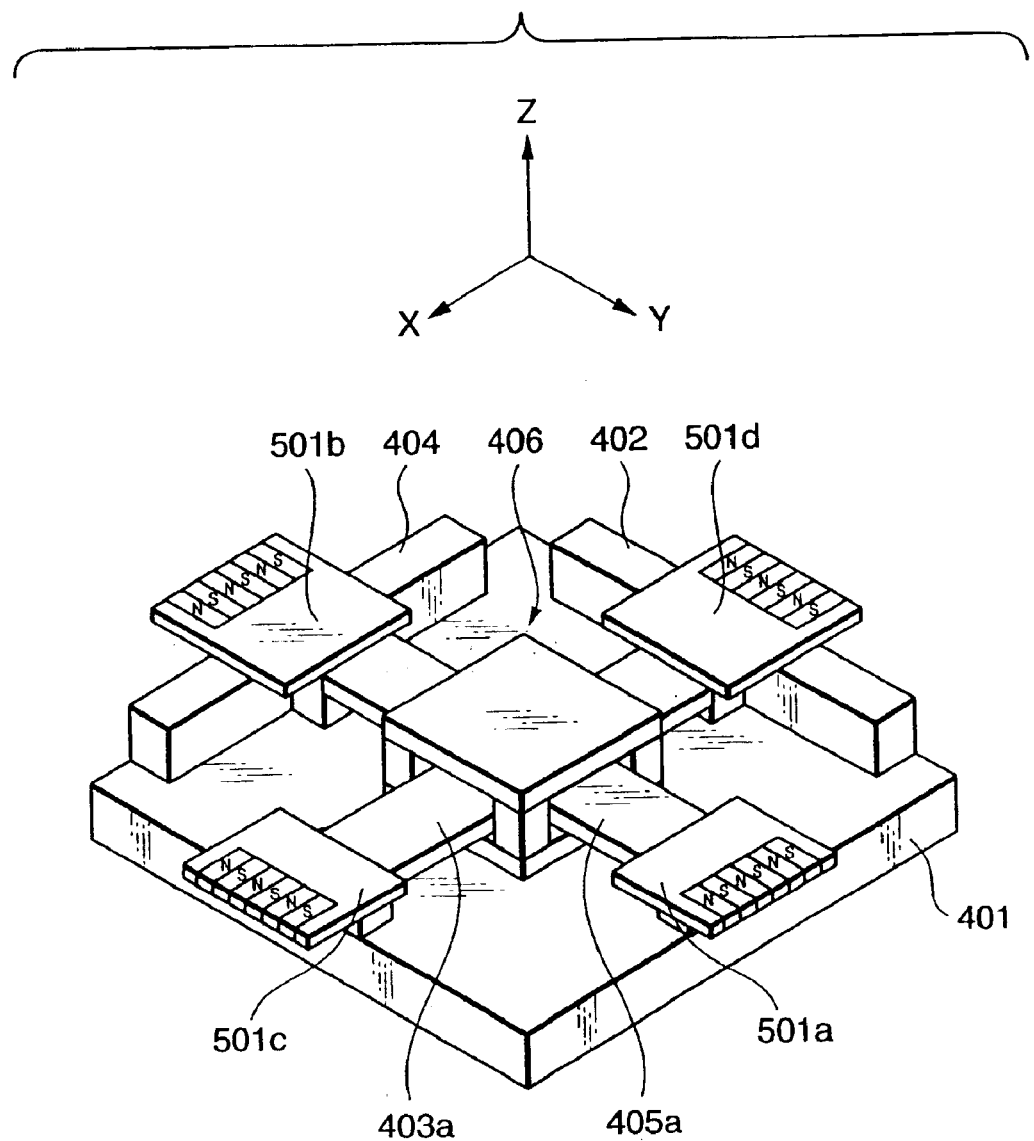
FIGS. 8A and 8B are views showing the arrangement of a coarse movement stage in the stage apparatus according to the second embodiment.
Figure 8B:
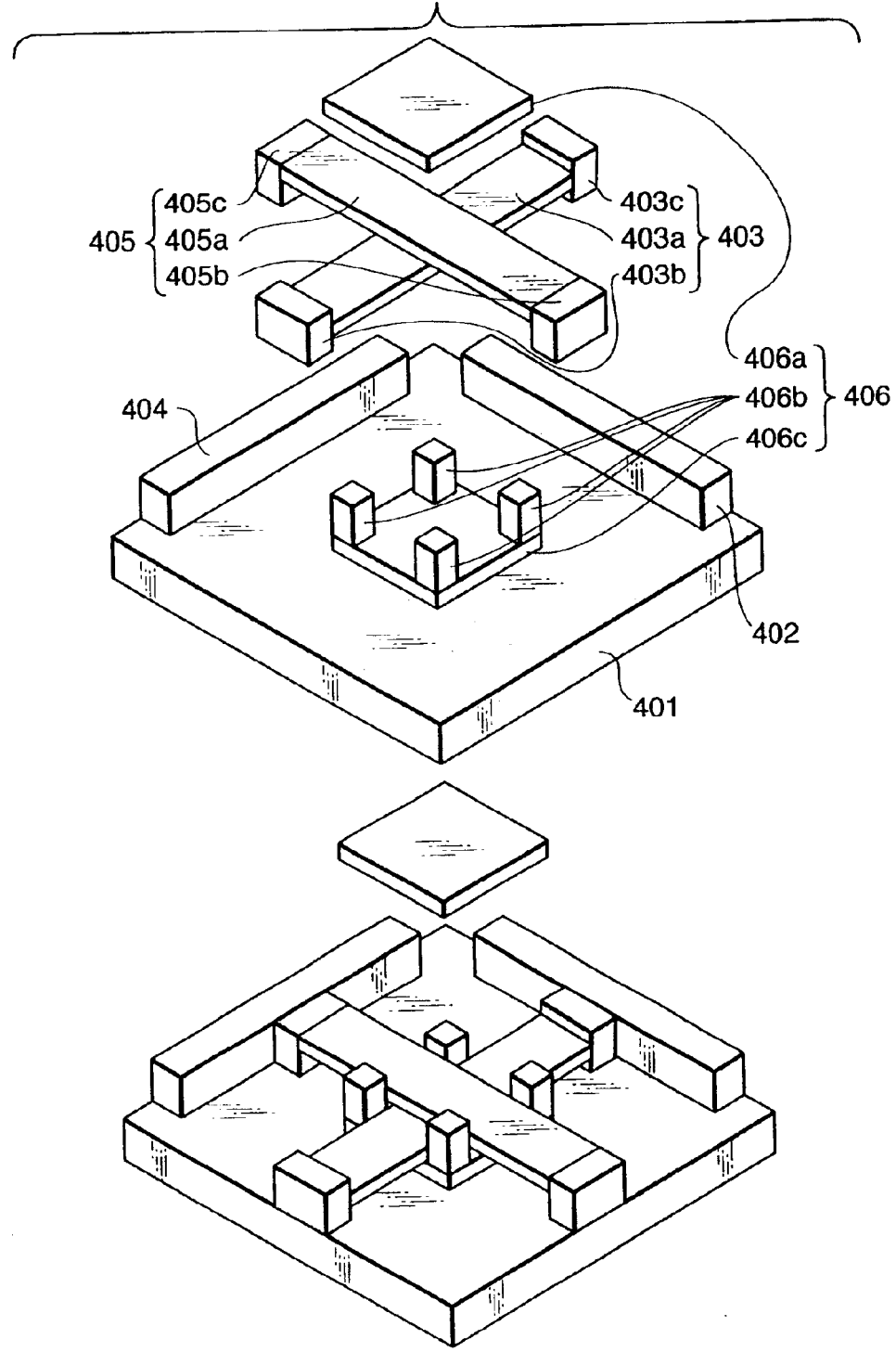
Figure 9:
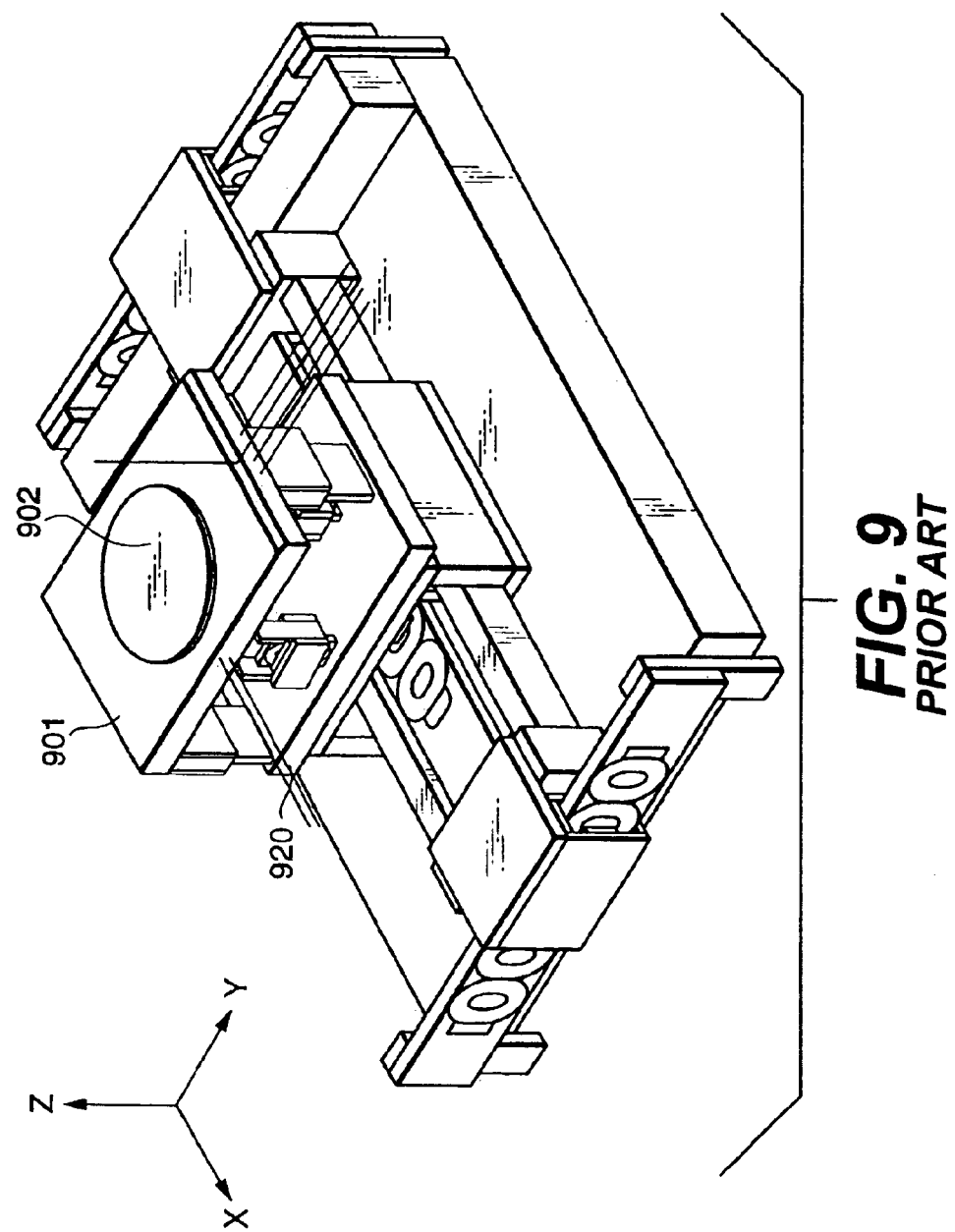
FIG. 9 is a view showing the general arrangement of a wafer stage in an exposure apparatus.

FIGS. 8A and 8B are views showing the arrangement of the coarse movement stage according to the second embodiment. A Y yaw guide 402 is fixed on a base surface plate 401, and a Y slider 403 guided by the side surface of the Y yaw guide 402 and the upper surface of the base surface plate 401 is supported above the base surface plate 401 by an air slide (not shown) to be slidable in the Y direction. The Y slider 403 is comprised of a Y beam 403a, Y front end member 403b, and Y rear end member 403c. The Y rear end member 403c faces the side surface of the Y yaw guide 402 and the upper surface of the base surface plate 401 through air pads (not shown) provided to its side and lower surfaces. The Y front end member 403b faces the upper surface of the base surface plate 401 through an air pad (not shown) provided to its lower surface. Consequently, the Y slider 403 as a whole is supported by the side surface of the Y yaw guide 402 and the upper surface of the base surface plate 401 to be slidable in the Y direction, as described above.

Independent of the above arrangement, an X yaw guide 404 is fixed on the base surface plate 401, and an X slider 405 guided by the side surface of the X yaw guide 404 and the upper surface of the base surface plate 401 is supported above the base surface plate 401 by an air slide (not shown) to be slidable in the X direction. The X slider 405 is comprised of an X beam 405a, X front end member 405b, and X rear end member 405c. The X rear end member 405c faces the side surface of the X yaw guide 404 and the upper surface of the base surface plate 401 through air pads (not shown) provided to its side and lower surfaces. The X front end member 405b faces the upper surface of the base surface plate 401 through an air pad (not shown) provided to its lower surface. Consequently, the X slider 405 as a whole is supported by the side surface of the X yaw guide 404 and the upper surface of the base surface plate 401 to be slidable in the X direction, as described above. The side surfaces of the X beam 405a and Y beam 403a form an air slide with respect to the columns of an X-Y slider 406 (to be described later).

The X-Y slider 406 is provided independently of the X slider 405 and Y slider 403. The X-Y slider 406 is comprised of a lower plate 406c, four columns 406b, and an upper plate 406a. The lower surface of the lower plate 406c and the upper surface of the base surface plate 401 are supported by an air slide (not shown) to be movable in the X, Y, and θ directions. The inner side surfaces of the four columns 406b face each other through air slides (not shown) between the side surfaces of the X beam 405a and Y beam 403a. Consequently, the movement of the X-Y slider 406 in the θ direction is constrained by the X slider 405 and Y slider 403, so the X-Y slider 406 can only be translated in the X or Y direction. This structure will be called a quartered-square structure.

An X front movable element 501a, X rear movable element 501b, Y front movable element 501c, and Y rear movable element 501d as the movable elements 501 of the linear motors described above are fixed on the X front end member 405b, X rear end member 405c, Y front end member 403b, and Y rear end member 403c of the stage having the above arrangement, and the linear motor stators (described above) corresponding to them are arranged to sandwich the respective movable elements in a noncontact manner (511a to 511d of FIG. 6A). Consequently, the X slider 405, Y slider 403, and X-Y slider 406 can be moved in the X, Y, and X-Y directions, respectively, by the linear motors.

The characteristic feature of the stage of this method resides in that the X linear motor is not mounted on the Y slider as in the first embodiment, but both the X and Y linear motors are fixed. Consequently, the drawback described above that the stator of the linear motor becomes heavy is overcome. This is because with the stage having this arrangement, even when the stator of the linear motor becomes heavy, the mass to be conveyed does not change, and the necessary thrust does not change. The stage of this method is also advantageous in that two linear motors can be arranged in each of the X and Y directions.

A combination of a coarse movement stage 400 as described above and the fine movement stage 100 described in the first embodiment forms a stage system according to the second embodiment. The operation and effect of the stage system are basically the same as those of the first embodiment, but heat generation by the linear motors for driving the coarse movement stage is further reduced. The stage having this structure can also be combined with the linear motor according to the first embodiment. More specifically, when the linear motor described with reference to FIGS. 7A and 7B is applied to the two Y-driving linear motors for driving the Y slider, heat generation during Y driving can be reduced more in the first embodiment.

<Modification>

The above embodiments exemplify a linear motor with a three-phase linear motor with an iron core which is generally used as a linear motor with an iron core. However, the number of phases is arbitrary and the driving method is not particularly limited. For example, a linear motor having a pulse motor structure, i.e., a linear motor of a type in which induction teeth are formed on a magnetic material such as an iron piece and a thrust is generated by the principle of a so-called electromagnetic gear, is also included in the category of the linear motor with an iron core of the present invention. Furthermore, the structures of all of a permanent magnet type pulsor motor, a hybrid type pulse motor, and a magnetoresistive change type (VR type) pulse motor are included in the category of the linear motor with an iron core of the present invention. These motors may be controlled in the same manner as pulse motors are, or may be controlled in the same manner as sync motors are, such that the phases of the magnetic fluxes and current become orthogonal, as described in the above embodiments.

Regarding a case wherein the coil side is defined as a stator as in the second embodiment, a structure having inducer teeth need not always include magnets on the movable element side, and a movable element can be formed only with an iron piece (magnetic material) provided with mere inducer teeth.

As has been described above, according to the present invention, heat generation by the linear motor for performing positioning in a stage apparatus can be reduced.

As many apparently widely different embodiments of the present invention can be made without departing from the spirit and scope thereof, it is to be understood that the invention is not limited to the specific embodiments thereof except as defined in the claims.

What is claimed is:

1. A stage apparatus comprising:
a first stage having a first table and a first linear motor portion with an iron core surrounded by a coil, wherein the first linear motor portion moves the first table with respect to a base table, the iron core has a protrusion and the coil is arranged so as to surround the protrusion;
a second stage having a second table and a second linear motor portion connected to the first table and the second table, wherein the second linear motor portion moves the second table with respect to the first table; and
an electromagnetic coupling provided between the first and second tables to apply an accelerating force to the second table in accordance with acceleration or deceleration of the first linear motor portion.

2. The apparatus according to claim 1, wherein when acceleration or deceleration is caused by the first linear motor portion, said electromagnetic coupling exerts an accelerating force on the second table in a direction of the acceleration or deceleration by using an electromagnetic force.

3. The apparatus according to claim 2, wherein a line of action of the electromagnetic force in said electromagnetic coupling passes a position of a barycenter of the second table and a member mounted thereon, as a whole.

4. The apparatus according to claim 1, wherein the second linear motor portion finely moves the second table in six-axis directions.

5. The apparatus according to claim 1, wherein the second linear motor portion finely moves the second table in six-axis directions, and compensates for degradation in position precision which is caused by cogging occurring in the first linear motor portion.

6. The apparatus according to claim 1, wherein, in the first linear motor portion, a stator has a row of permanent magnets arrayed over a moving range of a movable element, and the movable element has an electromagnet row formed by arraying a predetermined number of electromagnets having coils at iron cores thereof in a moving direction thereof.

7. The apparatus according to claim 1, wherein, in the first linear motor portion, a stator has a magnetic material that forms a row of iron teeth arrayed over a moving range of a movable element, and the movable element has an electromagnet row formed by arraying a predetermined number of electromagnets having coils at iron cores thereof in a moving direction thereof.

8. The apparatus according to claim 6, wherein
said first stage has an X slider and a Y slider movable in orthogonal X and Y directions, respectively, and the first linear motor portion includes X and Y linear motors for moving the X and Y sliders, respectively,
a stator and movable element of the Y linear motor are fixed to the base table and the Y slider, respectively, to move the Y slider in the Y direction with respect to the base table, and a stator and movable element of the X linear motor are fixed to the Y slider and X slider, respectively, to move the X slider in the X direction with respect to the Y slider, and the first table is connected to the X slider.

9. The apparatus according to claim 1, wherein, in the first linear motor portion, a stator has an electromagnet row formed by arraying a predetermined number of electromagnets having coils at iron cores thereof over a moving range of a movable element, and the movable element has a row of permanent magnets arrayed in a moving direction thereof.

10. The apparatus according to claim 1, wherein, in the first linear motor portion, a stator has an electromagnet row formed by arraying a predetermined number of electromagnets having coils at iron cores thereof over a moving range of a movable element, and the movable element has a magnetic material that forms a row of iron teeth arrayed in a moving direction thereof.

11. The apparatus according to claim 9, wherein said first stage has an X slider and a Y slider movable in orthogonal X and Y directions, respectively, and an X-Y slider, which moves following a position where the X and Y sliders intersect, the first linear motor portion includes X and Y linear motors for moving the X and Y sliders, respectively, stators of the X and Y linear motors are fixed to the base table, and movable elements of the X and Y linear motors are fixed to the X and Y sliders, respectively, and the first table is connected to the X-Y slider.

12. A method of driving a stage apparatus including:

a first stage having a first table and a first linear motor portion with an iron core surrounded by a coil, wherein the first linear motor portion moves the first table with respect to a base table, the iron core has a protrusion and the coil is arranged so as to surround the protrusion, a second stage having a second table and a second linear motor portion connected to the first table and the second table, wherein the second linear motor portion moves the second table with respect to the first table, and an electromagnetic coupling provided between the first and second tables to apply an accelerating force to the second table, the method comprising:

a movement control step of moving the second table by driving the first and second linear motor portions; and a driving step of driving the electromagnetic coupling in accordance with an acceleration or a deceleration operation by the first linear motor portion, thereby applying an accelerating force to the second table.

13. A stage apparatus comprising:

a first stage having a first table and a first linear motor portion with an iron core surrounded by a coil, wherein the first motor portion moves the first table with respect to a base table, the iron core has a protrusion and the coil is arranged so as to surround the protrusion;

a second stage having a second table and a second linear motor portion connected to the first table and the second table, wherein the second linear motor portion moves the second table with respect to the first table; and an electromagnetic coupling provided between the first and second tables to apply an accelerating force to the second table in accordance with acceleration or deceleration of the first linear motor, wherein at least one of force directions generated by said second linear motor portion is the same as a force direction generated by said electromagnetic coupling.

14. A stage apparatus comprising:

a first table;

a first linear motor, including an iron core surrounded by a coil, for driving said first table, wherein the iron core has a protrusion and the coil is arranged so as to surround the protrusion;

a second table;

a second linear motor for driving said second table with respect to said first table; and an electromagnetic coupling provided between said first and second tables to apply an accelerating force to said second table in accordance with acceleration or deceleration of said first linear motor.

* * * * *